(12) United States Patent
Yoshimura et al.

(10) Patent No.: US 9,010,384 B2
(45) Date of Patent: Apr. 21, 2015

(54) LOAD PORT

(75) Inventors: Takehiko Yoshimura, Tokyo (JP);
Tatsuhiko Nagata, Tokyo (JP); Masaru Seki, Tokyo (JP); Yoshinori Cho, Saitama (JP)

(73) Assignee: Right Mfg. Co. Ltd., Tokyo (JP)

( * ) Notice: Subject to any disclaimer, the term of this patent is extended or adjusted under 35 U.S.C. 154(b) by 584 days.

(21) Appl. No.: 13/364,789

(22) Filed: Feb. 2, 2012
(Under 37 CFR 1.47)

(65) Prior Publication Data

US 2013/0000757 A1 Jan. 3, 2013

Related U.S. Application Data

(63) Continuation-in-part of application No. 11/630,123, filed as application No. PCT/JP2004/009041 on Jun. 21, 2004, now abandoned.

(51) Int. Cl.
*B65B 31/04* (2006.01)
*H01L 21/54* (2006.01)
*B01L 1/00* (2006.01)
*H01L 21/677* (2006.01)

(52) U.S. Cl.
CPC ....... *H01L 21/67772* (2013.01); *Y10S 414/135* (2013.01)

(58) Field of Classification Search
CPC ................................................. H01L 21/67772
USPC .......... 454/187; 414/217, 217.1, 935; 141/59, 141/63, 66
See application file for complete search history.

(56) References Cited

U.S. PATENT DOCUMENTS

| | | | | |
|---|---|---|---|---|
| 4,851,018 A | * | 7/1989 | Lazzari et al. | 55/356 |
| 5,169,272 A | * | 12/1992 | Bonora et al. | 414/217.1 |
| 5,575,081 A | * | 11/1996 | Ludwig | 34/218 |
| 5,742,173 A | | 4/1998 | Nakagomi et al. | |
| 5,806,574 A | * | 9/1998 | Yamashita et al. | 141/63 |
| 5,934,991 A | * | 8/1999 | Rush | 454/187 |
| 5,997,398 A | | 12/1999 | Yamada et al. | |
| 6,044,874 A | * | 4/2000 | Saga | 141/63 |
| 6,135,168 A | * | 10/2000 | Yang et al. | 141/98 |
| 6,221,163 B1 | * | 4/2001 | Roberson et al. | 118/715 |
| 6,224,679 B1 | | 5/2001 | Sasaki et al. | |
| 6,430,802 B1 | * | 8/2002 | Miyajima | 29/464 |
| 6,561,894 B1 | * | 5/2003 | Miyajima | 454/187 |
| 6,641,349 B1 | * | 11/2003 | Miyajima et al. | 414/217 |

(Continued)

FOREIGN PATENT DOCUMENTS

| | | |
|---|---|---|
| JP | 08-262091 | 10/1996 |
| JP | 11-145245 | 5/1999 |

(Continued)

OTHER PUBLICATIONS

Notice of Reasons for Rejection issued to Taiwanese Application No. 93119461, mailed Jan. 15, 2010.

*Primary Examiner* — Steven B McAllister
*Assistant Examiner* — Frances H Kamps
(74) *Attorney, Agent, or Firm* — Dilworth & Barrese, LLP.

(57) ABSTRACT

A load part has a nozzle unit having outlets for generating outflow and/or inflow of gas used for replacing the atmosphere of a wafer storage container, in a direction approximately parallel to spaces between adjacent wafers being stored, are a driving unit for extending the nozzle unit to a door opening portion.

4 Claims, 24 Drawing Sheets

(56) References Cited

U.S. PATENT DOCUMENTS

| | | | |
|---|---|---|---|
| 6,704,998 B1 * | 3/2004 | Bonora et al. | 29/700 |
| 6,758,876 B2 * | 7/2004 | Suzuki et al. | 55/385.6 |
| 6,770,109 B2 * | 8/2004 | Tanaka et al. | 55/385.6 |
| 6,808,352 B2 * | 10/2004 | Seita | 414/217.1 |
| 6,817,822 B2 * | 11/2004 | Tokunaga | 414/217 |
| 6,867,153 B2 * | 3/2005 | Tokunaga | 438/800 |
| 7,014,672 B2 * | 3/2006 | Ishihara et al. | 55/356 |
| 7,037,189 B2 * | 5/2006 | Ohwada et al. | 454/191 |
| 7,337,792 B2 * | 3/2008 | Kamikawa et al. | 134/148 |
| 7,416,998 B2 * | 8/2008 | Kisakibaru et al. | 438/800 |
| 7,654,291 B2 * | 2/2010 | Miyajima et al. | 141/63 |
| 2002/0048509 A1 * | 4/2002 | Sakata et al. | 414/800 |
| 2002/0194995 A1 | 12/2002 | Shiramizu | |
| 2003/0031537 A1 | 2/2003 | Tokunaga | |
| 2004/0055650 A1 * | 3/2004 | Inoue et al. | 137/565.23 |
| 2004/0182472 A1 * | 9/2004 | Aggarwal | 141/98 |
| 2006/0272169 A1 * | 12/2006 | Miyajima | 34/211 |
| 2013/0042945 A1 * | 2/2013 | Emoto et al. | 141/98 |

FOREIGN PATENT DOCUMENTS

| | | | | |
|---|---|---|---|---|
| JP | 11145245 | * | 5/1999 | |
| JP | 2000-150613 | | 5/2000 | |
| JP | 2000-188318 | | 7/2000 | |
| JP | 2000188318 | * | 7/2000 | |
| JP | 2001-500669 | | 1/2001 | |
| JP | 2002-518824 | | 6/2002 | |
| JP | 2003-007813 | | 1/2003 | |
| JP | 2003-045933 | | 2/2003 | |
| JP | 2004-327911 | | 11/2004 | |
| TW | 497185 | | 8/2002 | |
| TW | 568347 | | 12/2003 | |
| WO | 98/11598 | | 3/1998 | |
| WO | 99/65064 | | 12/1999 | |
| WO | WO 2010007657 A1 | * | 1/2010 | H01L 21/673 |

* cited by examiner

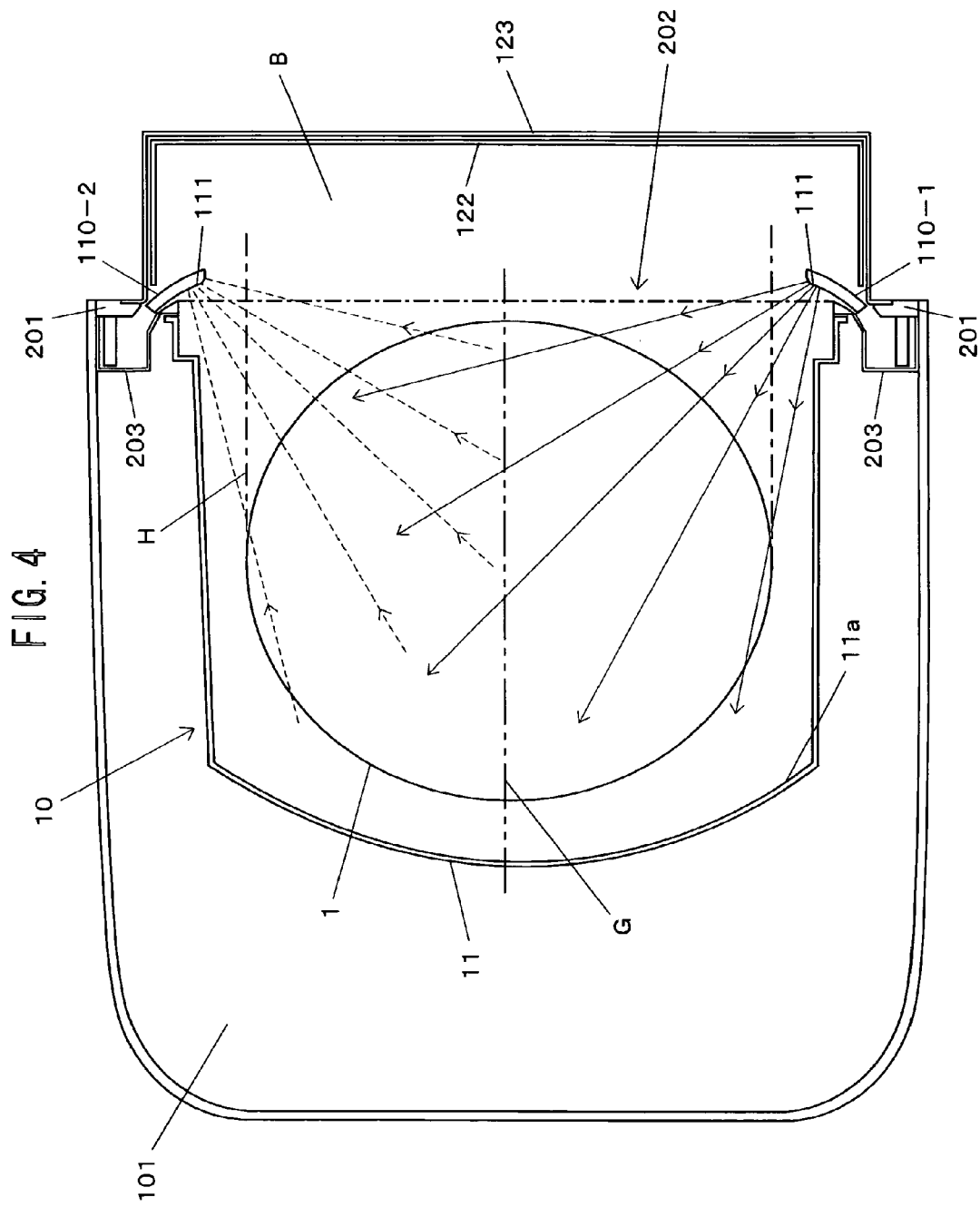

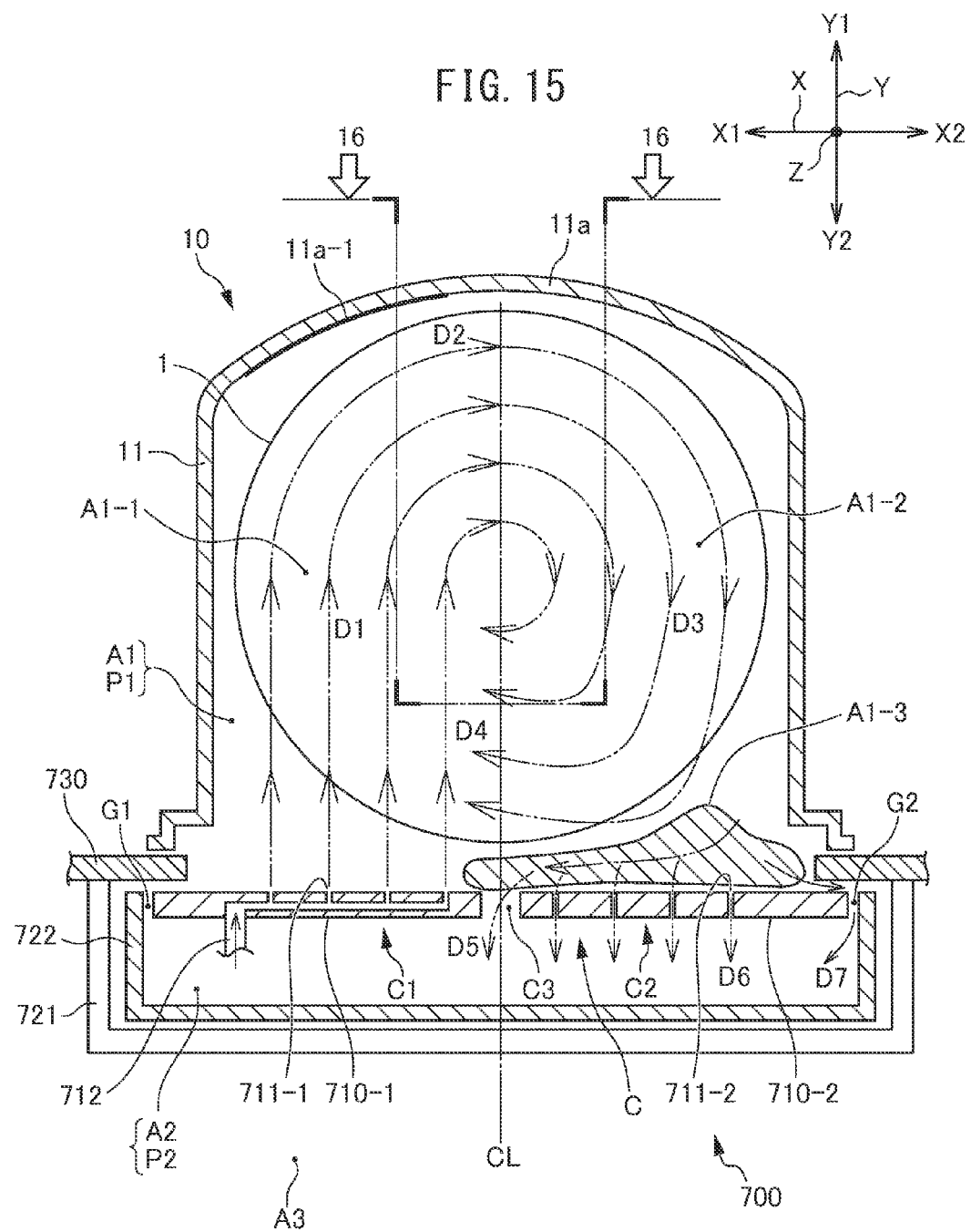

LOAD PORT

CROSS-REFERENCE TO RELATED APPLICATIONS

The instant application is a continuation-in-part of U.S. patent application Ser. No. 11/630,123, filed Dec. 19, 2006, now pending, and incorporated by reference herein.

BACKGROUND OF THE INVENTION

1. Field of the Invention

The present invention relates to a load port which is provided for a wafer processing apparatus for transferring various kinds of substrates (which will be referred to as "wafers" hereafter) such as silicon wafers, and which has a function of detaching/mounting a lid member (which will be referred to as "carrier door" hereafter) of a wafer storage container (which will be referred to as "wafer carrier" hereafter) for storing wafers at a predetermined pitch.

2. Related Art

Known examples of such kinds of conventional load ports include an arrangement that includes a load port door which has a function of engaging with a carrier door, and a load port door opening/closing mechanism that allows the load port door to be opened and closed, and that has a function of replacing (which will be referred to as "purging" hereafter) the atmosphere of a wafer carrier while maintaining the state in which the carrier door is opened.

Such a load port is disclosed in Japanese Unexamined Patent Application Publication No. 2003-45933 (which will be referred to as "Patent Document 1" hereafter) with reference to FIGS. 1 to 3. The load port disclosed in Patent Document 1 includes an upper wall face, a lower wall face, and an EFEM (Equipment Front End Module) door, etc., which serve as partitions between a predetermined space adjacent to the open face formed in the carrier door, and a processing space provided within a wafer processing apparatus, and has a function of purging the atmosphere of the wafer carrier through the aforementioned predetermined space.

However, with the load port disclosed in Patent Document 1, $N_2$ gas or the like used for purging the atmosphere of the wafer carrier (which will be referred to as "purge gas" hereafter) is supplied from the side obliquely above the open face of the wafer carrier.

In some cases, this leads to a problem of insufficient supply of the purge gas to the spaces between the adjacent wafers. Now, let us consider an arrangement in which purge gas is supplied with an increased flow amount. In some cases, even such an arrangement has a difficulty in sufficiently purging the atmosphere, and could lead to higher costs for purging the atmosphere.

Furthermore, the load port disclosed in Patent Document 1 includes the EFEM mechanism that allows the EFEM door to be opened and closed. This leads to a structure in which the EFEM mechanism protrudes toward the processing space provided within the wafer processing apparatus. This results in the problem that such a structure does not conform to the so-called SEMI standard, which specifies that any protrusion should be formed with a length of 100 mm or less from the wall face of a wafer processing apparatus.

SUMMARY OF THE INVENTION

It is an object of the present invention to provide a load port that enables the purge to be performed with high precision in a short period of time.

The present invention relates to a load port having a function of detachably mounting a lid member to a container opening of a wafer storage container for storing wafers therewithin at predetermined intervals by engaging the lid member with a door member of a door opening portion of a chamber into which each of the wafers is to be transferred, comprising: a nozzle unit having nozzle outlets for generating an outflow and/or an inflow of a gas, which is used for replacing the atmosphere of the wafer storage container, in a direction approximately parallel to the spaces between the adjacent wafers stored in the wafer storage container; and a driving unit for extending the nozzle unit to the door opening portion.

In the present invention, the nozzle unit may include a first nozzle unit for generating an outflow of the gas, and a second nozzle unit for generating an inflow of the gas. Also, the first nozzle unit and the second nozzle unit may be disposed approximately symmetrically with respect to the center line of the wafer storage container defined along the feeding direction along which the wafer is to be transferred to the chamber.

In the present invention, the nozzle outlets may be formed at positions that correspond to the spaces between the adjacent wafers.

In the present invention, the nozzle outlets may be formed at predetermined intervals along the vertical direction in which the wafers are stored within the wafer storage container.

In the present invention, the multiple nozzle outlets may be formed along a direction approximately oblique to the vertical direction.

In the present invention, the nozzle unit may be formed with a thickness twice or more the diameter of the nozzle outlets.

In the present invention, the nozzle unit may be an arc-shaped member provided such that it can be turned with a portion near a side end of the door opening portion serving as a turning axis, and can be stored at a position outside of the course of the wafer which is transferred from the wafer storage container to the chamber.

In the present invention, the driving unit may turn the nozzle unit with a portion near a side end of the door opening portion serving as a turning axis, thereby extending the nozzle unit from the side face of the door opening portion to the door opening portion.

In the present invention, the nozzle unit may be formed of a thin plate-shaped member which can be stored within a storage portion for storing the lid member, and in which the nozzle outlets have been formed over approximately the entire region such that they correspond to the spaces between the wafers.

In the present invention, the driving unit may extend the nozzle unit from a position near the lower end of the door opening portion to the door opening portion.

In the present invention, the nozzle unit may be formed of a tube-shaped member which can be stored within a storage portion for storing the lid member.

In the present invention, the driving unit may extend the nozzle unit from a position near the lower end of the door opening portion to the door opening portion.

In the present invention, the nozzle unit may be formed of a thin plate-shaped member in which the nozzle outlets have been formed over approximately the entire region such that they correspond to the spaces between the wafers, and which can be turned with a portion near an end of the upper portion of the door opening portion serving as a turning axis, thereby enabling the nozzle unit to be stored around the upper end of the door opening portion.

In the present invention, the driving unit may turn the nozzle unit with an end of the upper portion of the door opening portion serving as a turning axis, thereby extending the nozzle unit from a position near the upper end of the door opening portion to the door opening portion.

In the present invention, the nozzle unit may be formed of a tube-shaped member that can be turned with an end of the upper portion of the door opening portion serving as a turning axis, thereby allowing the nozzle unit to be stored around the upper end of the door opening portion.

In the present invention, the driving unit may turn the nozzle unit with an end of the upper portion of the door opening portion serving as a turning axis, thereby extending the nozzle unit from a position near the upper end of the door opening portion to the door opening portion.

In the present invention, the load port may further comprise an auxiliary nozzle unit which is provided around the upper end of the door opening portion, and which generates a gas flow in the shape of a slender planar curtain.

In the present invention, the load port may further comprise an airtight space forming unit which can be connected to the opening of the container in an airtight manner, thereby forming an airtight space that communicates with the interior space of the container.

In the present invention, the airtight space forming unit may comprise: the storage portion; an upper-portion cover member provided such that it faces the upper face of the storage portion; and an inner-face cover member which can be stored within the storage portion in a shape that follows the inner face of the storage portion, and which can be extended/retracted from/to the storage portion.

In the present invention, the load port may further comprise a flow control unit for switching the flow of the gas, which is generated by the nozzle unit, at a predetermined timing.

In the present invention, the flow control unit may comprise: a detection unit for detecting the gas concentration of the atmosphere of the wafer storage container; a switching unit for switching the flow of the gas generated by the nozzle unit; and a switching control unit for controlling the switching unit such that the gas concentration detected by the detection unit falls within a predetermined range, which is an indicator that indicates the degree of the replacement of the atmosphere.

In the present invention, the load port may further comprise an exhaust adjustment unit for adjusting the exhaust amount, which is discharged outside, such that the pressure of the airtight space is higher than the outside pressure while maintaining the state in which the atmosphere of the wafer storage container has been replaced using the nozzle unit.

In the present invention, the load port may further comprise a replacement control unit that replaces the atmosphere of the wafer storage container using the nozzle unit with the inner-face cover member being stored within the storage portion after the atmosphere of the wafer storage container has been replaced through the airtight space.

In the present invention, the nozzle unit may be formed of a thin plate-shaped member provided at a position outside of the course of the wafer which is transferred from the wafer storage container to the chamber. Also, an arrangement may be made in which the nozzle unit can be stored within a storage portion for storing the lid member.

In the present invention, the driving unit may extend the nozzle unit from a position around the lower end of the door opening portion to the door opening portion when the inner-face cover member, which can be extended/retracted from/to the storage portion, is extended from the storage portion.

In the present invention, the load port may further comprise a holding unit that allows the nozzle unit, which has been extended to the door opening portion by the driving unit, to be held at its extended position.

In the present invention, an arrangement may be made in which the nozzle unit can be stored within a storage portion for storing the lid member. Also, the nozzle outlets may be formed over approximately the entire region of the nozzle unit such that they correspond to the spaces between the wafers. Also, the nozzle unit may include a first thin plate-shaped member disposed at a position outside of the course of the wafer which is transferred from the wafer storage container to the chamber, and a second thin plate-shaped member disposed around the center of the door opening portion.

In the present invention, the driving unit may provide a function of extending the first thin plate-shaped member and the second thin plate-shaped member independently of one another from positions around the lower end of the door opening portion to the door opening portion.

In the present invention, the driving unit may provide a function of retracting the second thin plate-shaped member from the door opening portion while holding the first thin plate-shaped member at its extended position after the first thin plate-shaped member and the second thin plate-shaped member have been extended to the door opening portion.

In addition, the present invention provides a load port that is disposed between a wafer storage container having a lid member closing an aperture thereof and an inner wall of a curved surface so as to store wafers and a receiving room, into which the wafers inside the wafer storage container are conveyed. The load port includes an intermediate room, a gas supply plate configured like a plate, a partition, a gas outlet, and a driving unit. The intermediate room is disposed between the wafer storage container and the receiving room. The partition is configured like a plate to separate a partial region between the intermediate room and the wafer storage container. The gas outlet is configured to supply a replacement gas into the intermediate room. The driving unit is configured to: evacuate the lid member from the aperture of the wafer storage container into the intermediate room; position the gas supply plate in a region facing the aperture of the wafer storage container on one side with respect to a center line along a direction in which the wafers are conveyed; and position the partition in a region facing the aperture of the wafer storage container on another side opposite to the one side with respect to the center line, when the load port performs gas replacement. The gas supply plate includes a plurality of outlet nozzles configured to eject the replacement gas, each being arranged in agreement with a gap between adjacent wafers in a direction in which the wafers are layered. The plurality of outlet nozzles is formed in an entirety of the gas supply plate. The gas supply plate and the gas outlet are configured to supply the replacement gas such that a pressure of the receiving room is regulated to be lower than a pressure of the intermediate room. The gas inside the wafer storage container moves in a direction along the inside wall of the curved surface due to the replacement gas ejected through the plurality of outlet nozzles, subsequently circulating in a substantially entire region inside the wafer storage container since a pressure of the wafer storage container becomes higher than a pressure of a region adjacent to the partition. A part of the gas circulating inside the wafer storage container moves from inside the wafer storage container into the intermediate room through a gap between the gas supply plate and the partition due to a pressure difference between the wafer storage container and the intermediate room.

It may be that: the partition includes a plurality of inlet nozzles, each being arranged in agreement with the gap between the adjacent wafers in the direction in which the wafers are layered; the plurality of inlet nozzles is formed in an entirety of the partition; and a part of the gas circulating inside the wafer storage container moves from inside the wafer storage container into the intermediate room through the plurality of inlet nozzles in addition to the gap between the gas supply plate and the partition due to the pressure difference between the wafer storage container and the intermediate room.

Furthermore, it may be that the load port further includes a side wall and a side cover member. The side cover member has a side face arranged opposite to the side wall when the load port performs the gas replacement. The side wall and the side cover member form the intermediate room. The intermediate room includes a flow passage formed between the side wall and the side face of the side cover member. The flow passage causes the receiving room to fluidly communicate with the intermediate room and applies fluid resistance to a gas moving from the receiving room into the intermediate room.

According to the present invention, the nozzle unit generates an outflow and/or an inflow of a gas from the openings of the nozzle unit toward the spaces between wafers so as to replace the atmosphere of the wafer storage container. Furthermore, the nozzle unit can be extended to the door opening portion. Such an arrangement provides a gas flow toward the spaces between the wafers with high efficiency, thereby reducing the period of time necessary to replace the atmosphere of the wafer storage container. At the same time, this provides high-precision replacement of the atmosphere.

In addition, the present invention provides advantages below.

Each of the plurality of outlet nozzles is arranged in agreement with the gap between the adjacent wafers in the direction in which the wafers are layered. Furthermore, the plurality of outlet nozzles is formed in the entirety of the gas supply plate. Accordingly, it is possible to decrease a velocity of the replacement gas even if a considerable amount of the replacement gas is ejected between the wafers at a time, allowing the replacement gas to move in a laminar flow. As a result, it is possible to increase the efficiency of removing moisture and foreign materials (particles) in the vicinity of a surface of a wafer.

The present invention supplies the replacement gas from the region facing the aperture of the wafer storage container and employs the inner wall of the curved surface of the wafer storage container and the partition to allow the replacement gas to circulate in the substantially entirety of the wafer storage container. Accordingly, a centrifugal force occurs, which causes the foreign materials to move from an inner periphery to an outer periphery of a wafer. In addition, it is possible to cause the foreign materials to move from the wafer storage container into the intermediate room along with a gas, by utilizing the pressure difference between the wafer storage container and the intermediate room. In this manner, it is possible to remove the foreign materials from the wafer storage container.

It is possible for the present invention to cause a gas that moves along the partition, which is a part of the gas circulating inside the wafer storage container, to move from the wafer storage container into the intermediate room through the plurality of inlet nozzles. Accordingly, it is possible to increase the efficiency associated with the replacement of gasses.

Since the present invention includes the passage that applies the fluid resistance to the gas moving from the receiving room into the intermediate room, it is possible to increase the air tightness of the intermediate room and provide easier pressure control of the intermediate room.

BRIEF DESCRIPTION OF THE DRAWINGS

FIG. 4 is a cross-sectional view which shows the load port with the wafer carrier mounted in the purge step, according to the embodiment 1 of the present invention.

FIG. 15 is a plan sectional view showing a load port and a wafer carrier according to a seventh embodiment.

DETAILED DESCRIPTION OF THE INVENTION

A further description will be given of embodiments of the present invention with reference to the drawings.

First Embodiment

A load port 100 includes a wall face 201 or the like having a door opening portion 202 on which an unshown door member (which will be referred to as "load port door" hereafter) is detachably mounted. The load port 100 is installed on the wall face of an unshown wafer processing apparatus for performing predetermined processing for wafers 1.

Figure 1:
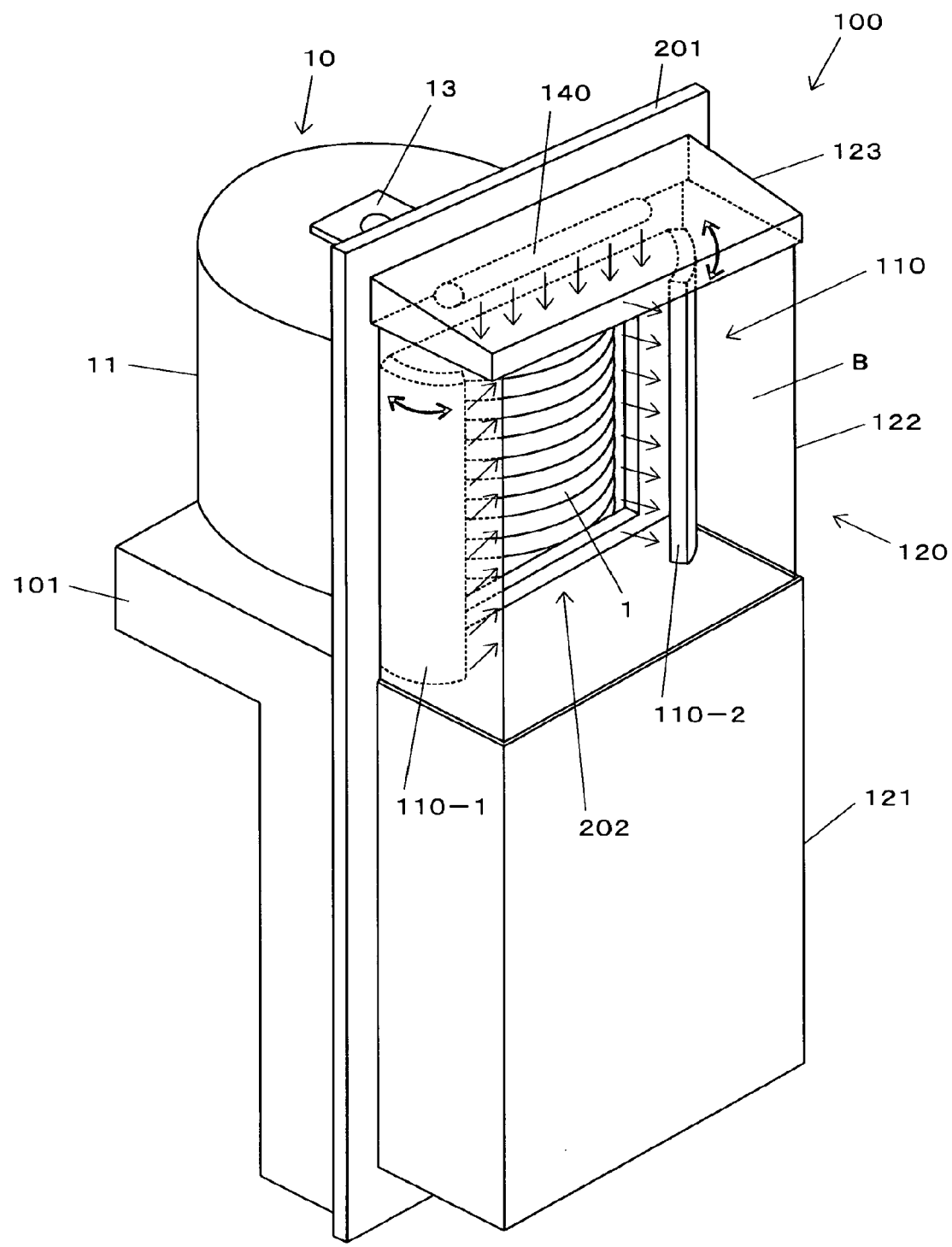
FIG. 1 is a perspective view which shows a load port mounting a wafer carrier in a purge step, according to an embodiment 1 of the present invention.

As shown in FIG. 1, a wafer carrier 10 is a container for storing the wafers 1 therewithin at a predetermined pitch (at a pitch of around 10 mm). The wafer carrier 10 includes a carrier shell 11, and a carrier door 16 (see FIG. 3) or the like for sealing the container opening 12 of the carrier shell 11. Note that known examples of such carriers include an FOUP (Front Opening Unified Pod) and an FOSB (Front Opening Shipping Box).

Figure 2:
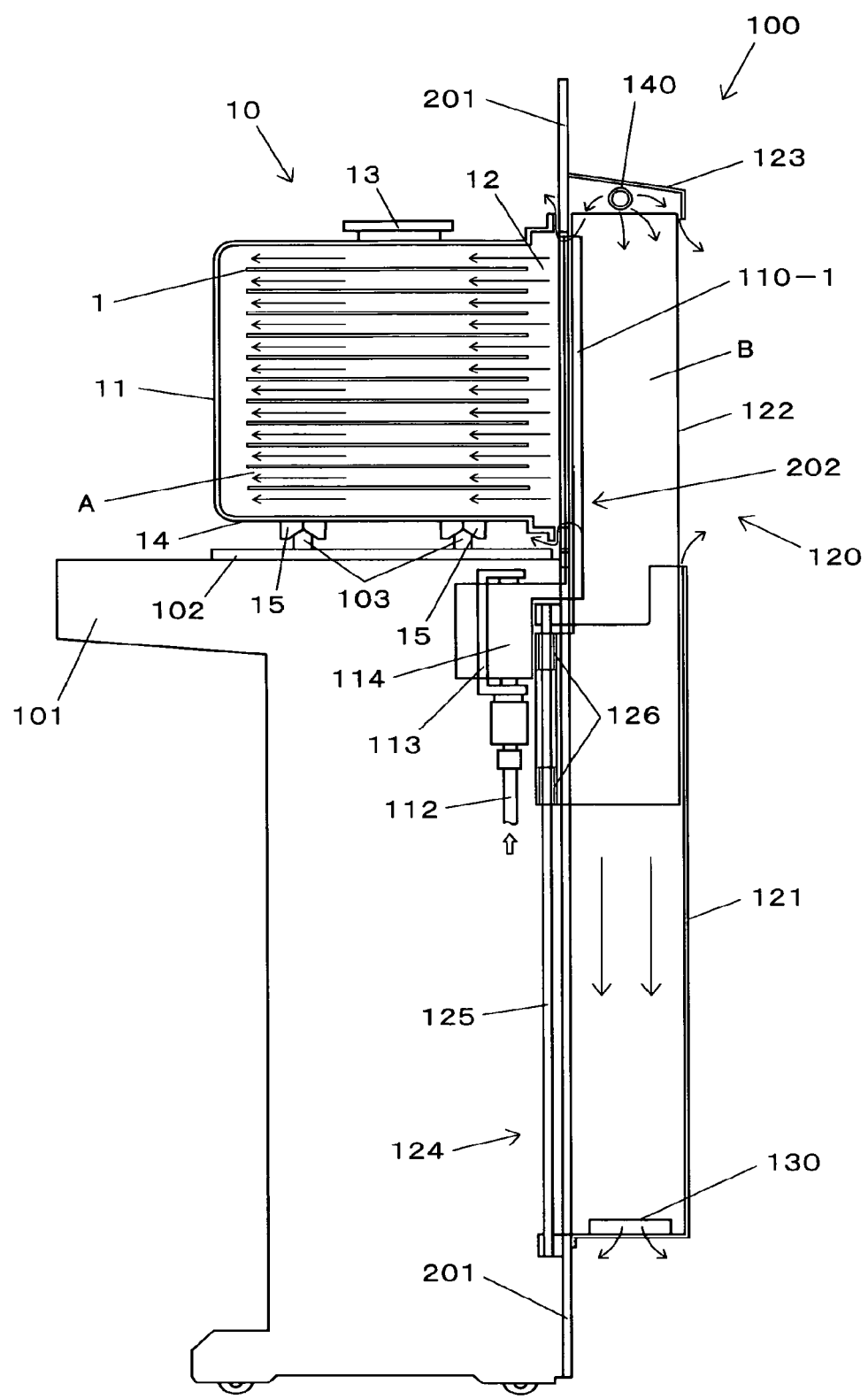
FIG. 2 is a side view which shows the load port mounting the wafer carrier in the purge step, according to the embodiment 1 of the present invention.

The carrier shell 11 includes a curved inner wall 11a (see FIG. 4) formed at a position opposite to the container opening 12. Furthermore, the carrier shell 11 includes a robot flange 13 on the upper portion thereof as shown in FIG. 2, which allows an unshown automatic transfer apparatus to hold the carrier shell 11. Furthermore, the carrier shell 11 includes V-shaped groove portions 15 in which V-shaped grooves have been formed.

The load port 100 is an apparatus having a function of detaching/mounting the carrier door 16 with the carrier door 16 for the container opening 12 of the wafer carrier 10 being engaged with the load port door of the door opening portion 202 of the load port 100. The load port 100 includes: a mounting base 101 for mounting the wafer carrier 10 transferred from the automatic transfer apparatus; a moving base 102 which is movably provided on the mounting base 101; a load port door opening/closing mechanism 170 (see FIG. 7) which is provided within a storage portion 121 described later, and which allows the load port door engaged with the carrier door 16 to be opened/closed; a nozzle unit 110 (see FIG. 1); an airtight space forming unit 120; an exhaust adjustment unit 130; an auxiliary nozzle unit 140; etc. The moving base 102 includes kinematic pins 103 or the like on the upper portion for positioning the wafer carrier 10. The kinematic pins 103 are engaged with the aforementioned V-shaped groove portions 15 provided to the bottom face of the carrier shell 11.

The nozzle unit 110 includes a first nozzle unit 110-1 for generating an outflow (or inflow) of the purge gas, and a second nozzle unit 110-2 for generating an inflow (or outflow) of the purge gas, which allows the atmosphere of the wafer carrier 10 to be purged.

Note that the first nozzle unit 110-1 and the second nozzle unit 110-2 have approximately the same structure and functions, and accordingly, a description will be given below mainly regarding the first nozzle unit 110-1.

The first nozzle unit 110-1 has nozzle outlets 111 (see FIG. 6) or the like for generating an outflow of the purge gas in a direction approximately parallel to the spaces between the adjacent wafers 1 stored in the wafer carrier 10 as shown in FIG. 2.

Figure 7:
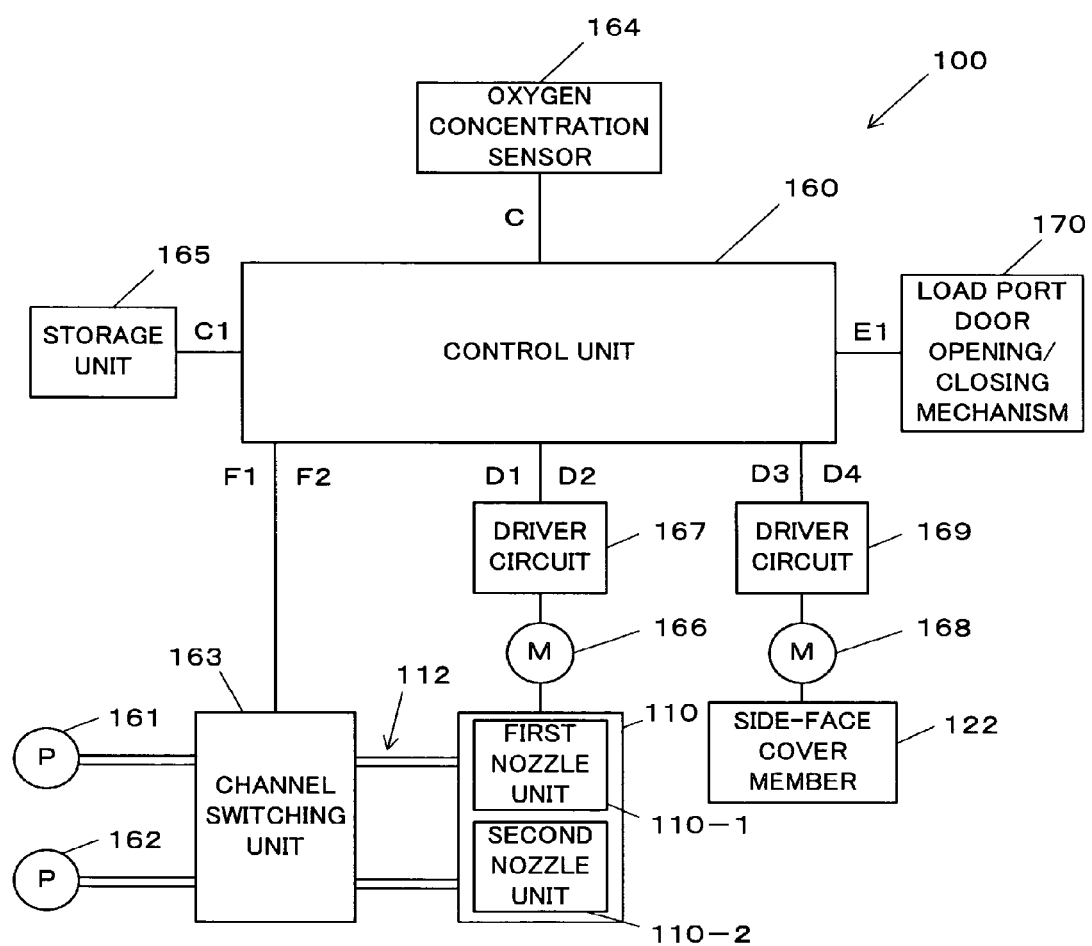
FIG. 7 is a block diagram which shows the load port according to the first embodiment of the present invention.

The first nozzle unit 101-1 is a member having an arc cross-sectional shape provided such that it can be turned with a portion near the side end of the door opening portion 202 serving as the turning axis, thereby allowing the first nozzle unit 110-1 to be extended and retracted with respect to the door opening portion 202 by the nozzle driving motor 166 or the like (see FIG. 7).

When the first nozzle unit 110-1 is retracted from the door opening portion 202, the first nozzle unit 110-1 is stored within a clean space which is defined by the wall face 201 and an outer wall face 203 connected to the wall face 201, and which communicates with an airtight space B described later. Such an arrangement prevents the first nozzle unit 110-1 from being contaminated.

On the other hand, when the first nozzle unit 110-1 is extended to the door opening portion 202, the first nozzle unit 110-1 is located outside of the course H of the outer edge of the wafer 1 which is transferred from the wafer carrier 10 to the wafer processing apparatus.

With such an arrangement, each wafer 1 can be transferred to a processing space within the wafer processing apparatus for executing predetermined processing with a side-face cover member 122 described later being stored in the storage portion 121, while maintaining the state in which the atmosphere in the wafer carrier 10 is purged by the first nozzle unit 110-1 extended to the door opening portion 202. Such an arrangement improves the operating efficiency.

On the other hand, the first nozzle unit 110-1 and the second nozzle unit 110-2 are disposed approximately symmetrically with respect to the center line G of the wafer carrier 10 defined along the feeding direction along which each wafer 1 is to be transferred to the processing space in the wafer processing apparatus. Accordingly, the purge gas flowing out from the nozzle outlets 111 of the first nozzle unit 110-1 in a direction approximately parallel to the spaces A, between the adjacent wafers 1 stored in the wafer carrier 10, is diffused along the inner wall 11a formed in the carrier shell 11 in the shape of a curved face, up to around the container opening 12. Subsequently, the purge gas enters the second nozzle unit 110-2 disposed approximately symmetrical to the first nozzle unit 110-1 with respect to the center line G.

Figure 3:
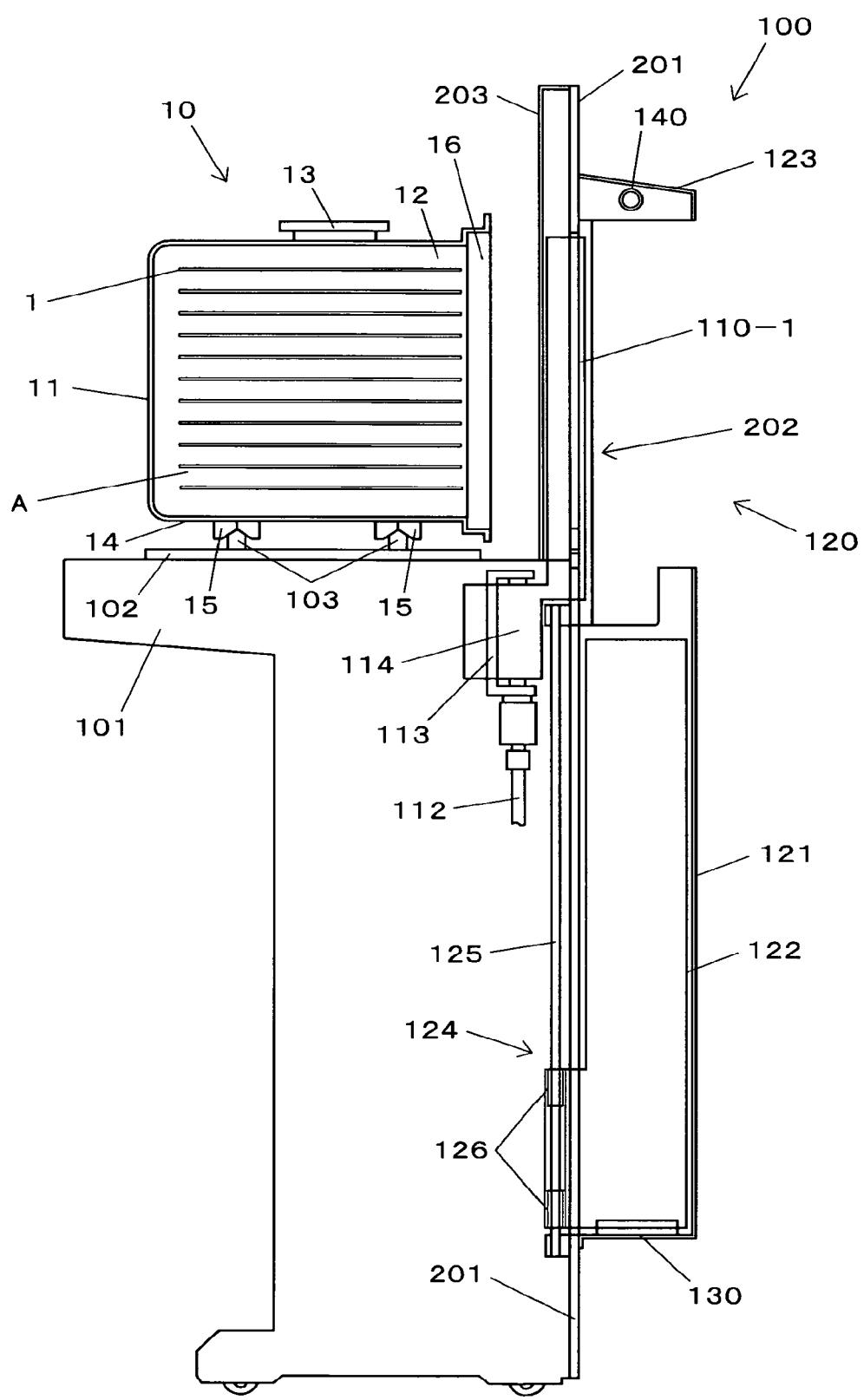
FIG. 3 is a side view which shows the load port with the wafer carrier mounted after the purge step, according to the embodiment 1 of the present invention.
Figure 5A:
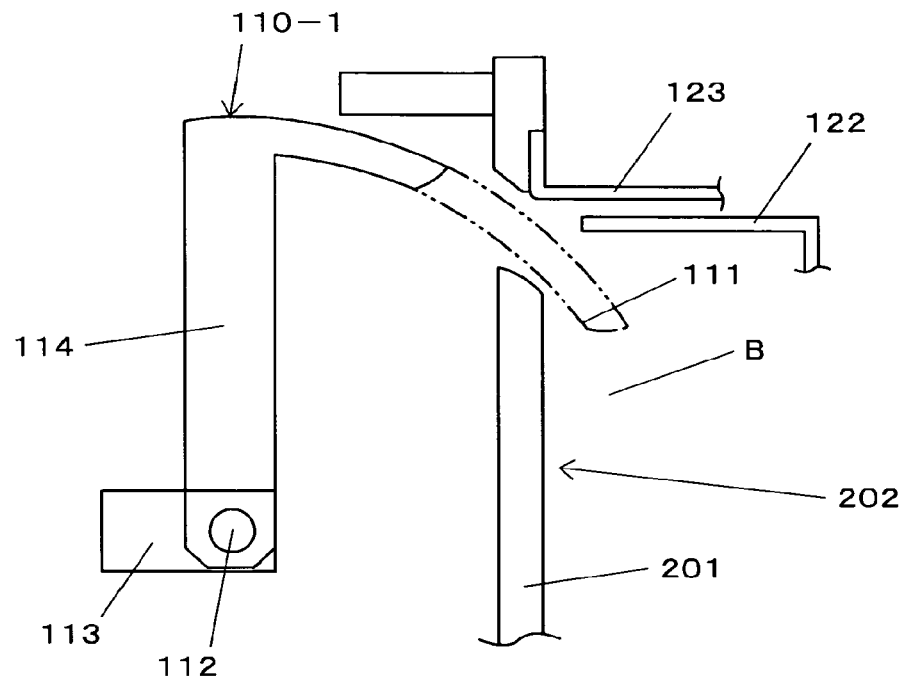
FIG. 5A is a diagram which shows a state in which a first nozzle unit has been extended to a door opening portion.
Figure 5B:
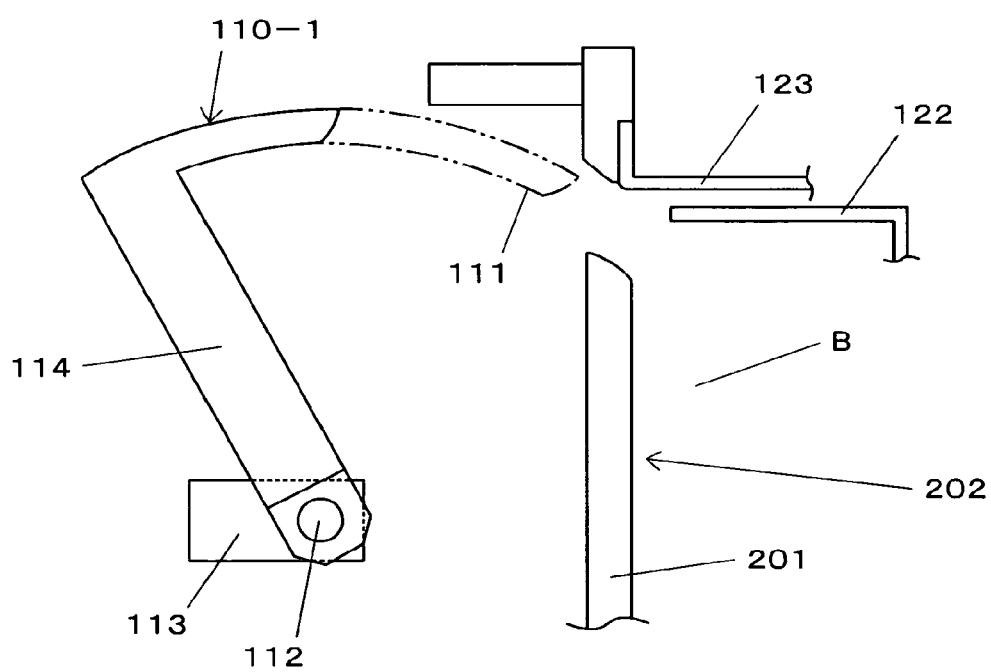
FIG. 5B is a diagram which shows a state in which the first nozzle unit has been retracted from the door opening portion.

The first nozzle unit 110-1 includes: a pipe 112 which also serves as a rotational shaft that allows the first nozzle unit 110-1 to be turned; a support member 113 for supporting the rotational shaft through a bearing; a crank-shaped arm member 114 provided such that the pipe 12 passes through the arm member 114; etc., at the lower portion of the first nozzle unit 110-1, as shown in FIGS. 2, 3, and 5. FIG. 5A is a diagram which shows the state in which the first nozzle unit 110-1 has been extended to the door opening portion 202. On the other hand, FIG. 5B is a diagram which shows the state in which the first nozzle unit 110-1 has been retracted from the door opening portion 202. Here, the portion indicated by the alternate long-and-two-short-dash line represents a part of the arm member 114 which is to be extended to the door opening portion 202, and which is positioned on a plane that differs from that on which the other parts are positioned.

The pipe 112 is connected to a channel switching unit 163 such as a solenoid valve or the like at one end thereof, and is provided so as to allow the purge gas to pass therethrough (see FIG. 7). Furthermore, the pipe 112 also serves as a rotational shaft, and is connected to the nozzle driving motor 166 through an unshown connecting member or the like. Furthermore, the pipe 112 is provided so as to pass through the arm member 114. Moreover, unshown orifices are formed at the passing-through portion, which enables the purge gas to flow on the inside of the first nozzle unit 110-1. With such an arrangement, the purge gas, which has passed through the inside of the pipe 112, passes through the inside of the arm member 114 through the orifices, whereby the purge gas flows out from the nozzle outlets 111.

The airtight space forming unit 120 provides a function of forming the airtight space B that communicates with the interior space of the wafer carrier 10 by connecting the airtight space forming unit 120 to the container opening 12 in an airtight manner as shown in FIG. 2. The airtight space forming unit 120 includes the storage portion 121, a side-face cover member 122, an upper portion cover member 123, etc. The side-face cover member 122 is formed such that it can be stored in the storage portion 121 in a shape such that it follows the inner face of the storage portion 121. Furthermore, an elevator mechanism 124, which is driven by a side-face cover elevator motor 168 (see FIG. 7) described later, is provided, which enables the side-face cover member 122 to be raised and lowered from/to the storage portion 121.

The elevator mechanism 124 includes a shaft 125 disposed near the wall face 201, multiple ball slides 126 movably provided to the shaft 125, etc. The shaft 125 is provided such that it passes through a tab formed at a lower portion of the side-face cover member 122. The side-face cover member 122 is held through the ball slides 126 provided to the tab. Furthermore, an arm or the like is provided, which is connected to an unshown belt mechanism or the like driven by the side-face cover elevator motor 168. The belt mechanism allows the side-face cover member 122 to be raised and lowered along the shaft 125. The upper portion cover member 123 is provided near the upper end of the door opening portion 202 such that it faces the upper face of the storage portion 121.

Upon raising the side-face cover member 122 from the storage portion 121 by the elevator mechanism 124, and upon detaching the carrier door 16 from the container opening 12 by the load port door opening/closing mechanism 170, the airtight space forming unit 120 provides the airtight space B defined by the upper face of the storage portion 121, the side-face cover member 122, and the upper-portion cover member 123.

A gap (around 1 mm) is formed between the side-face cover member 122 and the upper-portion cover member 123. Furthermore, another gap (around 0.5 to 1 mm) is formed between the carrier shell 11 and the wall face 201. Now, let us consider the case in which the outflow of the purge gas flowing from the first nozzle unit 110-1 is greater than the inflow of the purge gas into the second nozzle unit 110-2. In this case, such a structure allows the purge gas to flow to the outside of the airtight space B (e.g., the outside of the wafer carrier 10 or the processing space provided within the wafer processing apparatus).

The exhaust adjustment unit 130 includes an exhaust opening or the like having a function of adjusting the opening area thereof by an unshown micro-motor or the like. The exhaust adjustment unit 130 adjusts the opening area of the exhaust opening such that the pressure of the airtight space B is greater than the pressure of the outside of the airtight space B in a state in which the airtight space B is formed, and the atmosphere of the wafer carrier 10 is purged by the first nozzle unit 110-1.

For example, let us consider the case in which there is an outflow of the purge gas of 100 L/min from the nozzle outlets 111 of the first nozzle unit 110-1 in a direction approximately parallel to the spaces A between the adjacent wafers 1, and there is an inflow of 60 L/min into the second nozzle unit 110-2. In this case, the exhaust adjustment unit 130 adjusts the opening area of the exhaust opening such that the purge gas flows to the outside of the airtight space B at a flow speed less than 40 L/min from the gap between the side-face cover member 122 and the upper-portion cover member 123, the gap between the carrier shell 11 and the wall face 201, and the exhaust opening of the exhaust adjustment unit 130. Accordingly, the exhaust adjustment unit 130 allows the pressure of the airtight space B to be greater than the pressure of the outside. Such an arrangement enables the airtight space B to be protected from infiltration of air or the like from the gap between the side-face cover member 122 and the upper-portion cover member 123 and the gap between the carrier shell 11 and the wall face 201 in a sure manner.

The auxiliary nozzle unit 140 is provided within the upper-portion cover member 123, and has a function of generating an outflow of the purge gas approximately downward, thereby forming a slender planar air curtain. The air curtain prevents the purge gas, which flows out from the nozzle outlets 111 of the first nozzle unit 110-1, from flowing in a direction behind the first nozzle unit 110-1 (the side of the processing space provided within the wafer processing apparatus). This prevents the purge efficiency from dropping.

On the other hand, in the case that the load port 100 stops the purge, the side-face cover member 122 is stored within the storage portion 121 by the elevator mechanism 124. Furthermore, the carrier door 16 is mounted to the container opening 12 of the carrier shell 11 by the load port door opening/closing mechanism 170. Then, the load port 100 moves the moving base 103 such that it is distanced from the wall face 201, whereupon the wafer carrier 10 is moved to a so-called home position.

Figure 6A:
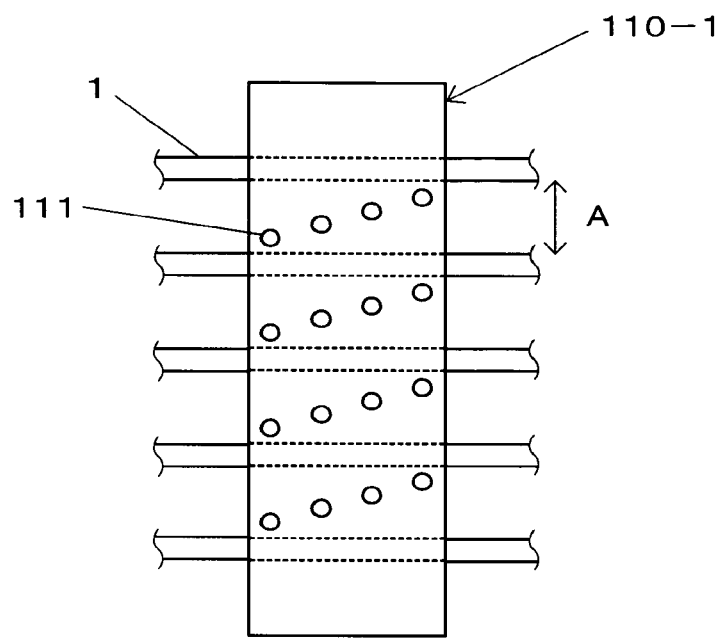
FIG. 6A is a diagram which shows a state in which the first nozzle unit has been extended to the door opening portion such that it faces the wafers stored within the wafer carrier.
Figure 6B:
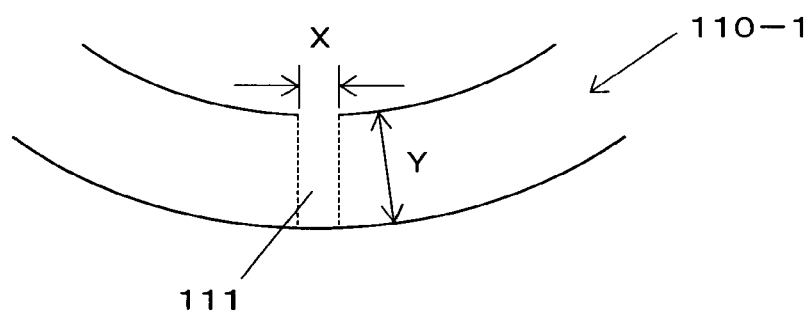
FIG. 6B is a cross-sectional view of the first nozzle unit.

Next, a description will be given regarding the nozzle outlets 111. Note that FIG. 6A shows a state in which the first nozzle unit 110-1 has been extended to the door opening portion 202 such that it faces the wafers 1 stored within the wafer carrier 10. FIG. 6B shows a cross-sectional view of the first nozzle unit 110-1.

As shown in FIG. 6A, the nozzle outlets 111 are formed at predetermined intervals such that they are located at positions corresponding to the spaces A between the adjacent wafers 1 stored within the wafer carrier 10. Such an arrangement provides a function of generating a uniform outflow of the purge gas in a direction approximately parallel to the spaces A between the adjacent wafers 1. Furthermore, the nozzle outlets 111 are formed at predetermined intervals along a direction approximately oblique to the direction (vertical direction) along which the multiple wafers 1 are stored within the wafer carrier 10. Accordingly, the nozzle outlets 1 generate a flow of the purge gas with the diffusion range thereof changing along the vertical direction. Such an arrangement allows the purge gas to be diffused in a wide range even in the case that the nozzle outlets 111 have been formed in a narrow region.

With such an arrangement, the nozzle outlets 111 are formed such that the thickness Y of the first nozzle unit 110-1 is twice or more (three times, for example) the diameter X of each nozzle outlet 111 based upon experimental results with respect to the directional stability of the purge gas.

Thus, the nozzle outlets 111 are capable of generating an outflow of the purge gas toward the spaces A between the wafers 1 with high efficiency. Such an arrangement allows the consumption of the purge gas to be reduced, thereby reducing costs for the purge.

As shown in FIG. 7, the load port 100 includes the channel switching unit 163, an oxygen concentration sensor 164, a storage unit 165, the nozzle unit 110 comprising the first nozzle unit 110-1 and the second nozzle unit 110-2, the nozzle driving motor 166, a driver circuit 167, the side-face cover member 122, the side-face cover elevator motor 168, a driver circuit 169, the load port door opening/closing mechanism 170, etc. With such an arrangement, these components are electrically connected to each other. On the other hand, the channel switching unit 163 is a solenoid valve or the like for switching the channel of the purge gas. The channel switching unit 163 is connected to a feed pump 161 for supplying the purge gas from an unshown purge gas tank, an intake pump 162 for drawing the purge gas such that it is transported to an unshown tank, and the nozzle unit 110, through the pipe 112 etc.

Figure 8:
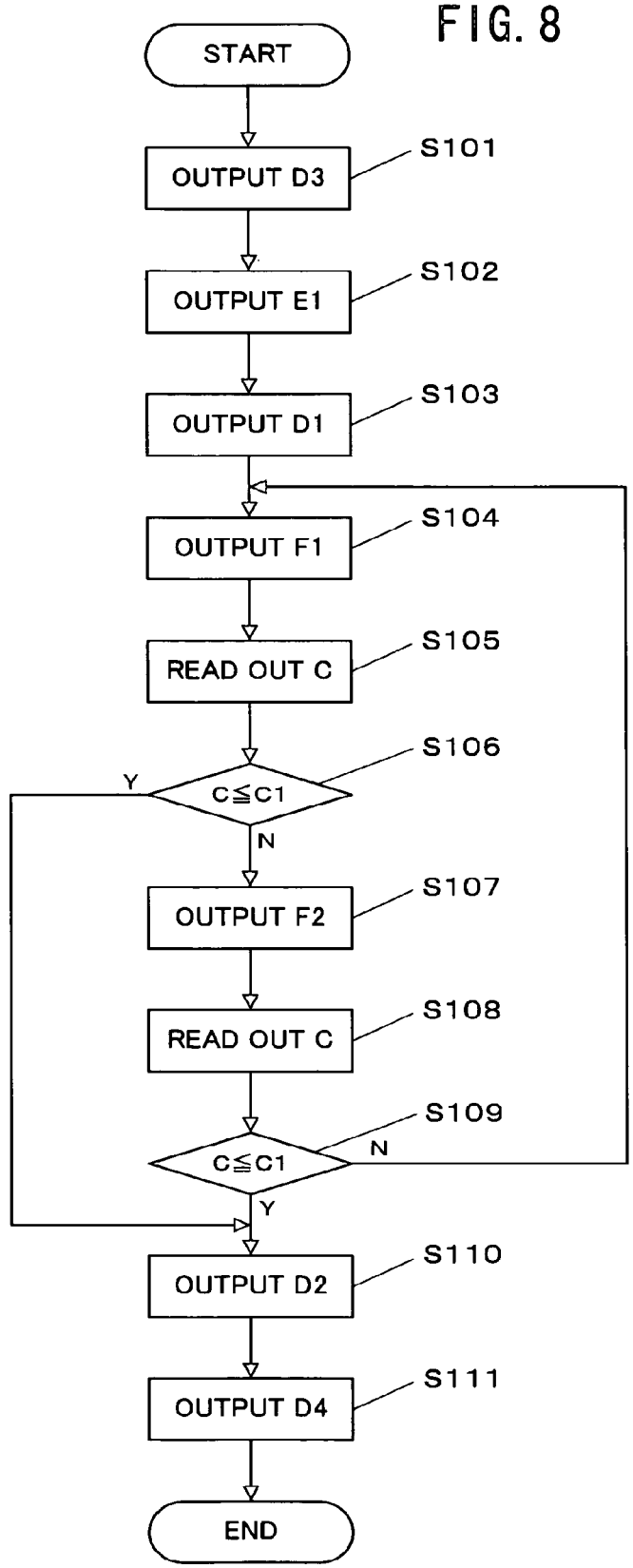
FIG. 8 is a flowchart which shows the operation of the load port according to the first embodiment of the present invention.

A description will be given below regarding the operation of the load port 100, mainly regarding a control unit 160 when performing the purge, with reference to FIGS. 7 and 8.

First, the control unit 160 outputs a signal D3 to the side-face cover elevator motor 168 (S101). The side-face cover elevator motor 168 is connected to the control unit 160 via the driver circuit 169. Upon the control unit 160 outputting the signal D3, the side-face cover elevator motor 168 drives the elevator mechanism 124 so as to raise the side-face cover member 122 stored within the storage portion 121.

Next, the control unit 160 outputs a signal E1 to the load port door opening/closing mechanism 170 (S102). Upon the control unit 160 outputting the signal E1, the load port door opening/closing mechanism 170 engages the load port door of the door opening portion 202 with the carrier door 16, and detaches the carrier door 16 from the container opening 12. In this stage, the airtight space B is formed, which communicates with the interior space of the wafer carrier 10.

The control unit 160 outputs a signal D1 to the nozzle driving motor 166 (S103). The nozzle driving motor 166 is connected to the control unit 160 via the driver circuit 167. With such an arrangement, upon the control unit 160 outputting the signal D1, the nozzle driving motor 166 rotationally drives the pipe 112, which is provided to the lower portion of the first nozzle unit 110-1 and which also serves as a rotational shaft, thereby extending the first nozzle unit 110-1 toward the door opening portion 202 from the side face of the door opening portion 202.

The control unit 160 outputs a signal F1 to the channel switching unit 163 (S104). Upon the control unit 160 outputting the signal F1, the channel switching unit 163 connects the feed pump 161 and the first nozzle portion 110-1, and connects the intake pump 162 and the second nozzle unit 110-2. In this stage, the purge gas flows out from the first nozzle unit 110-1, and flows into the second nozzle unit 110-2.

Next, the control unit 160 reads out a detection signal C detected by the oxygen concentration sensor 164 (S105). The oxygen concentration sensor 164 is a sensor for detecting the oxygen concentration of the atmosphere of the wafer carrier 10, and has a function of detecting the detection signal C that is obtained by performing A/D conversion of a signal detected according to the oxygen concentration. The oxygen concentration is an indicator that indicates the degree of purging of the atmosphere of the wafer carrier 10. Note that the purge is preferably performed with an oxygen concentration of between 0.1 to 1.0%, which indicates the optimum purge degree. Specifically, the oxygen concentration sensor 164 comprises a titania oxygen sensor or the like formed of titania ($TiO_2$) as a sensor element material, for example. The titania oxygen sensor detects the oxygen concentration based upon the change in the electrical resistance due to oxidation/reduction of the titania. In Step S105, the oxygen concentration is detected, instead of the nitrogen concentration. Examples of the reasons include the lower cost of the oxygen concentration sensor as compared to that of the nitrogen concentration sensor.

Next, the control unit 160 reads out a threshold signal C stored beforehand in the storage unit 165, and which is used in a switching step for switching the flow of the purge gas. Then, the control unit 160 determines whether or not the detection signal C obtained in Step S105 is equal to or less than the threshold signal C1 (S106). The storage unit 165 comprises nonvolatile memory, and stores beforehand a predetermined range (e.g., a range of 0.1% to 1.0%) of the oxygen concentration that indicates the optimum purge degree. Furthermore, the storage unit 165 stores the oxygen concentration (e.g., 1.0%), which is used as a threshold for switching the flow of the purge gas, in the form of the threshold signal C1.

In the case that the detection signal C is equal to or less than the threshold signal C1, the control unit 160 determines that the purge has been sufficiently performed, and outputs a signal D2 to the nozzle driving motor 166 (S110). Upon the control unit 160 outputting the signal D2, the nozzle driving motor 166 rotationally drives the pipe 112, which also serves as a rotational shaft, in the rotational direction reverse to that when the signal D1 is output, thereby retracting the first nozzle unit 110-1 to the side face of the door opening portion 202.

On the other hand, in the case that the detection signal C is greater than the threshold signal C1, the control unit 160 determines that the purge thus performed is insufficient, and outputs a signal F2 to the channel switching unit 163 (S107). Upon the control unit 160 outputting the signal F2, the channel switching unit 163 connects the intake pump 162 and the first nozzle unit 110-1, and connects the feed pump 161 and the second nozzle unit 110-2. Accordingly, the purge gas flows out from the second nozzle unit 110-2, and flows into the first nozzle unit 110-1.

Subsequently, after the readout of the detection signal C detected by the oxygen concentration sensor 164 again (S108), the control unit 160 reads out the aforementioned threshold signal C1 from the storage unit 165. Then, the control unit 160 determines whether or not the detection signal C obtained in Step S108 is equal to or less than the threshold signal C1 (S109).

In the case that the detection signal C is equal to or less than the threshold signal C1, the control unit 160 determines that the purge has been sufficiently performed, and the flow proceeds to the aforementioned Step S110 where the control unit 160 outputs the signal D2 to the nozzle driving motor 166. On the other hand, in the case that the detection signal C is greater than the threshold signal C1, the control unit 160 determines that the purge thus performed is insufficient, and the flow returns to Step S104 again where the control unit 160 outputs the signal F1 to the channel switching unit 163. That is to say, the control unit 160 controls the switching of the flow of the purge gas such that the detection signal C level is at the threshold signal C1 or less, i.e., such that the purge is sufficiently performed.

Next, after Step S110 where the first nozzle unit 110-1 has been retracted from the door opening portion 202, the control unit 160 outputs a signal D4 to the side-face cover elevator motor 168 (S111). Upon the control unit 160 outputting the signal D4, the side-face cover elevator motor 168 rotates in the direction reverse to that when the signal D3 is output. This drives the elevator mechanism 124, thereby storing the side-face cover member 122 within the storage portion 121. In this stage, the airtight space B is released, i.e., the interior space of the wafer carrier 10 communicates with the processing space provided within the wafer processing apparatus.

Subsequently, the wafer 1 is transferred to the processing space of the wafer processing apparatus by the wafer transfer robot of the wafer processing apparatus. After predetermined processing, the wafer 1 is stored in the wafer carrier 10 again. Furthermore, upon completion of the predetermined processing for the wafers 1, the carrier door 16 is closed by the load port door opening/closing mechanism 170.

The load port 100 generates an outflow of the purge gas toward the spaces A between the adjacent wafers 1 with high efficiency. Such an arrangement reduces the period of time necessary to purge the atmosphere of the wafer carrier 10. Also, such an arrangement enables the load port 100 to perform a predetermined purge step with a reduced flow of the purge gas.

The load port 100 has a function of extending/retracting the nozzle unit 110 toward/from the door opening portion 202. Such an arrangement allows the distance between the wall face 201 and the end face of the storage portion 121 that faces the processing space to be reduced, for example. That is to say, such an arrangement can be made in accordance with the so-called SEMI standard.

The load port 100 controls the switching of the flow of the purge gas according to the oxygen concentration such that the purge degree of the atmosphere of the wafer carrier is at the optimum state. Accordingly, such an arrangement enables the atmosphere gas remaining around the curved inner wall 11a of the wafer carrier 10 to flow around the nozzle unit 110, and enables the atmosphere gas to flow into the nozzle unit 110, thereby providing high-precision purging.

A description will be given below regarding load ports according to other embodiments. Note that, in each embodiment, the same components as those in the above-described load port 100 are denoted by the same reference numerals, and description will be omitted regarding the functions thereof, etc., as appropriate.

Second Embodiment

Figure 9:
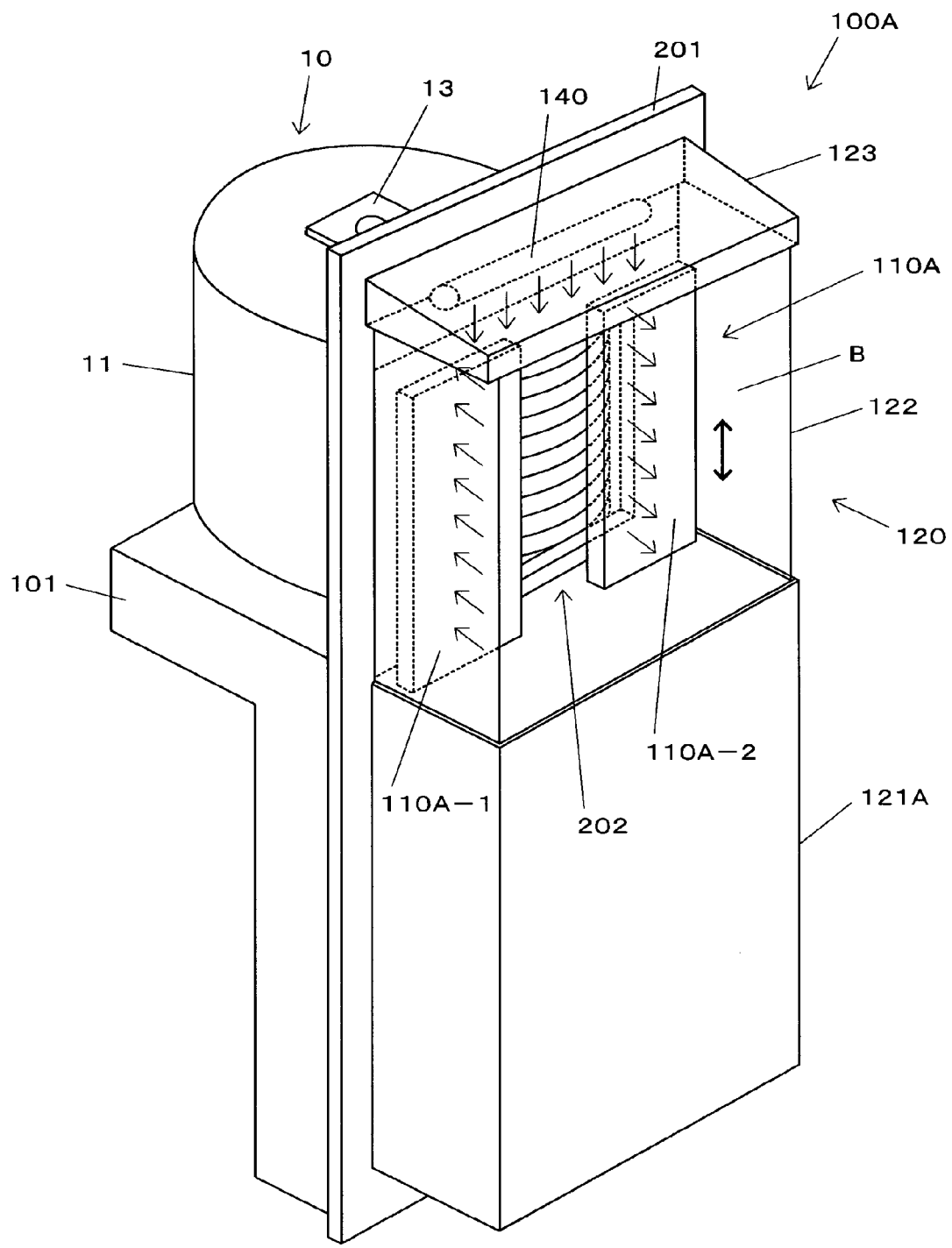
FIG. 9 is a perspective view which shows a load port with the wafer carrier mounted in a purge step, according to the second embodiment of the present invention.

As shown in FIG. 9, the difference between the load port 100A and the load port 100 is that the load port 100A includes a nozzle unit 110A instead of the nozzle unit 110.

The nozzle unit 110A comprises thin plate-shaped members that can be stored in a storage portion 121A. The nozzle unit 110A includes nozzle outlets formed approximately over the entire area thereof such that they correspond to the spaces between the adjacent wafers 1. The nozzle outlets are formed in the nozzle unit 110A in the shape of a matrix at predetermined intervals. Each nozzle outlet is formed with a diameter equal to or smaller than ½ of the thickness of the nozzle unit 110A (e.g., with a diameter of ⅓ of the thickness of the nozzle unit 110A).

As described above, the nozzle unit 110A comprises thin plate-shaped members. Accordingly, such an arrangement allows the nozzle unit 110A to be raised from the storage portion 121A by an appropriate nozzle unit elevator mechanism employing belts, ball screws, etc., without interference with the load port door opening/closing mechanism 170.

Thus, the load port 100A provides a function of raising the nozzle unit 110A from the storage portion 121, which is positioned at the lower end of the door opening portion 202, by driving the nozzle unit elevator mechanism by the nozzle driving motor 166, thereby enabling the nozzle unit 110A to be extended to the door opening portion 202.

Furthermore, the nozzle outlets are formed approximately over the entire area of the nozzle unit 110A in the shape of a matrix such that they correspond to the spaces A between the adjacent wafers 1. With such an arrangement, the purge gas flows out from approximately the entire area of a first nozzle unit 110A-1, and flows into approximately the entire area of a second nozzle unit 110A-2.

Thus, the load port 100A provides a high-efficiency purge, thereby reducing the period of time necessary for the purge.

Third Embodiment

Figure 10:
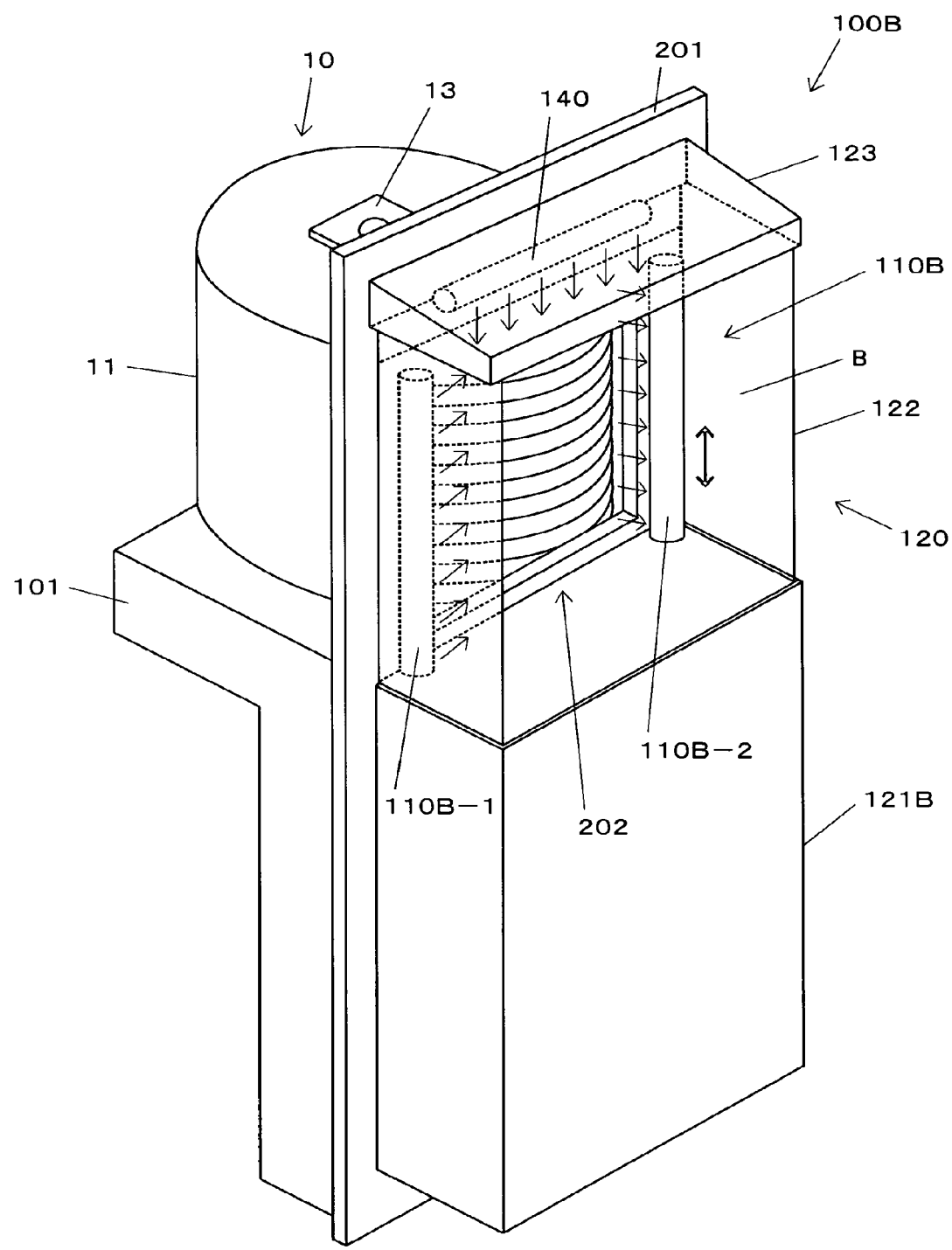
FIG. 10 is a perspective view which shows a load port with the wafer carrier mounted in a purge step, according to the third embodiment of the present invention.

As shown in FIG. 10, the difference between the load port 100B and the load port 100 is that the load port 100B includes a nozzle unit 110B instead of the nozzle unit 110.

The nozzle unit 110B comprises tube-shaped members that can be stored in a storage portion 121B. The nozzle unit 110B includes nozzle outlets formed at positions that correspond to the spaces A between the wafers 1. Each nozzle outlet is formed with a diameter equal to or smaller than ½ of the thickness of the nozzle unit 110B (e.g., with a diameter of ⅓ of the thickness of the nozzle unit 110B) (see FIG. 6).

As described above, the nozzle unit 110B is stored in the storage portion 121B. Accordingly, an arrangement in which a pipe for supplying the purge gas is connected to the lower portion of the nozzle unit 110B suffices. That is to say, there is no need to provide a particular mechanism for turning the nozzle unit 110 as shown in FIG. 2, for example.

Such an arrangement provides a simple mechanism for the lower portion of the nozzle unit 110B. Also, such an arrangement has a function of raising the nozzle unit 110B from the storage portion 121, which is positioned at the lower end of the door opening portion 202, by the nozzle driving motor 166 that drives the nozzle unit elevator mechanism having approximately the same configuration as that of the load port 100A, thereby extending the nozzle unit 110B toward the door opening portion 202.

Fourth Embodiment

Figure 11:
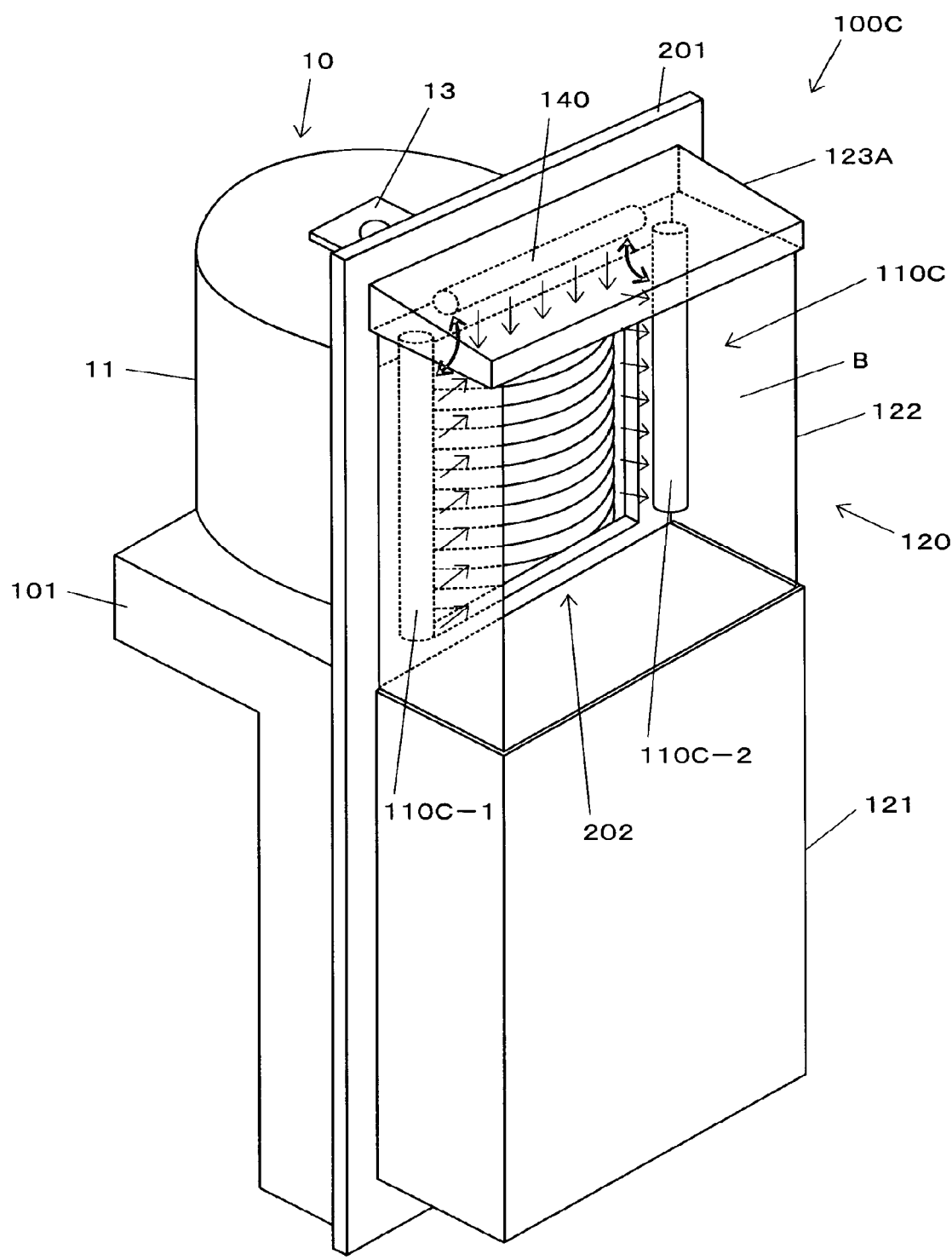
FIG. 11 is a perspective view which shows a load port with the wafer carrier mounted in a purge step, according to the fourth embodiment of the present invention.

As shown in FIG. 11, the difference between the load port 100C and the load port 100 is that the load port 100C includes a nozzle unit 110C instead of the nozzle unit 110.

The nozzle unit 110C comprises a first nozzle unit 110C-1 and a second nozzle unit 110C-2, which are tube-shaped members, and which can be stored along an upper-portion cover member 123A such that they are stacked on one another. The nozzle unit 110C includes nozzle outlets formed at positions that correspond to the spaces A between the wafers 1. Each nozzle outlet is formed with a diameter equal to or smaller than ½ of the thickness of the nozzle unit 110O (e.g., with a diameter of ⅓ of the thickness of the nozzle unit 110C) (see FIG. 6).

Furthermore, the load port 100C includes an appropriate nozzle unit turning mechanism near the upper end of the door opening portion 202, which allows the tube-shaped members of the nozzle unit 110C to be turned with the left and the right ends of the upper portion of the door opening portion 202 serving as the turning axes.

Accordingly, with the load port 100C, there is no need to provide a particular nozzle unit elevator mechanism to the storage portion 121, thereby offering a simple mechanism of the storage portion 121. With such an arrangement, the nozzle unit turning mechanism is driven by the nozzle driving motor 166 so as to turn the tube-shaped members of the nozzle unit 110C with the left and the right ends of the upper portion of the door opening portion 202 serving as the turning axes, thereby extending the nozzle unit 110C toward the door opening portion 202 from the position near the upper end of the door opening portion 202.

Fifth Embodiment

Figure 12:
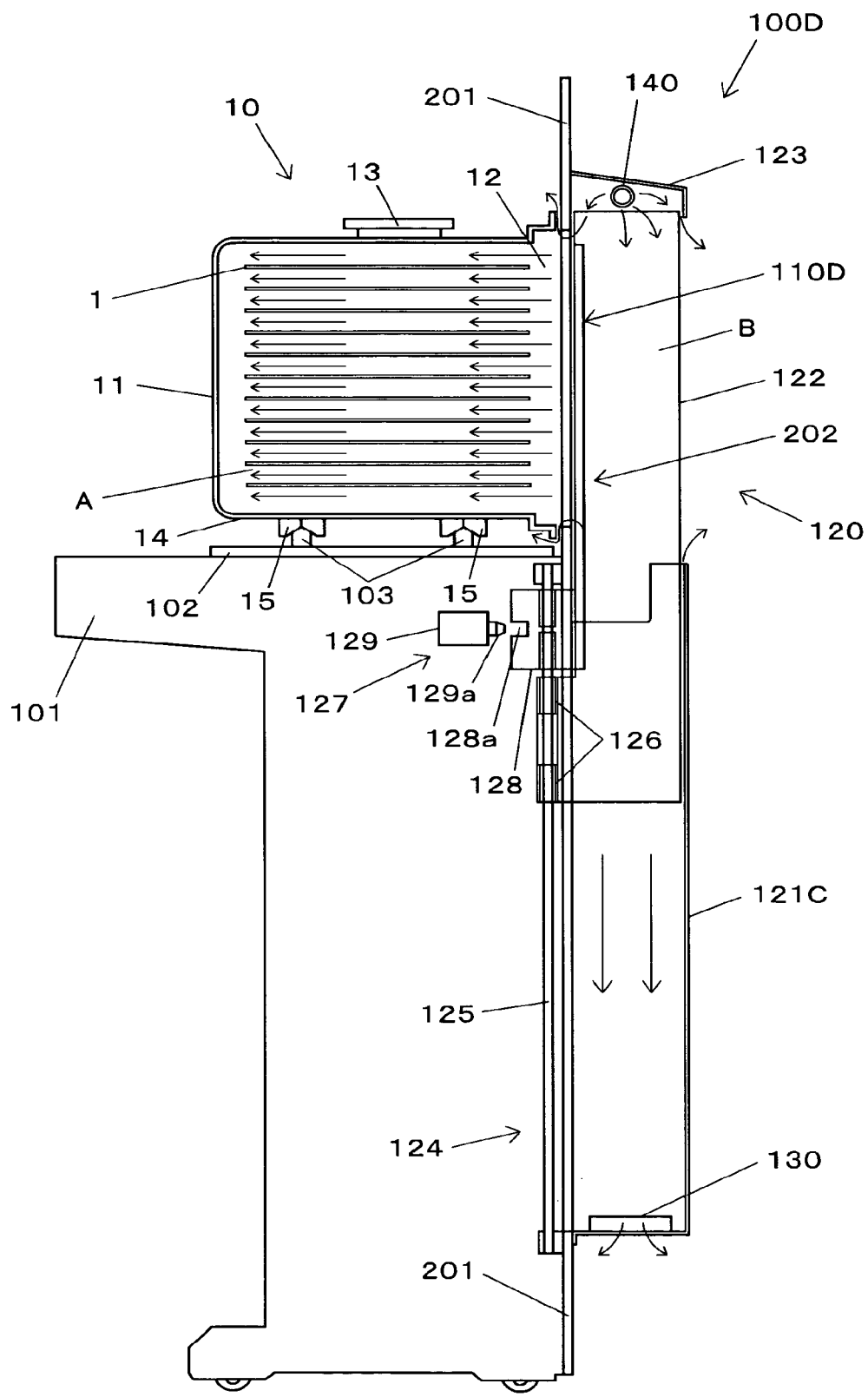
FIG. 12 is a side view which shows a load port with the wafer carrier mounted in a purge step, according to the fifth embodiment of the present invention.
Figure 13:
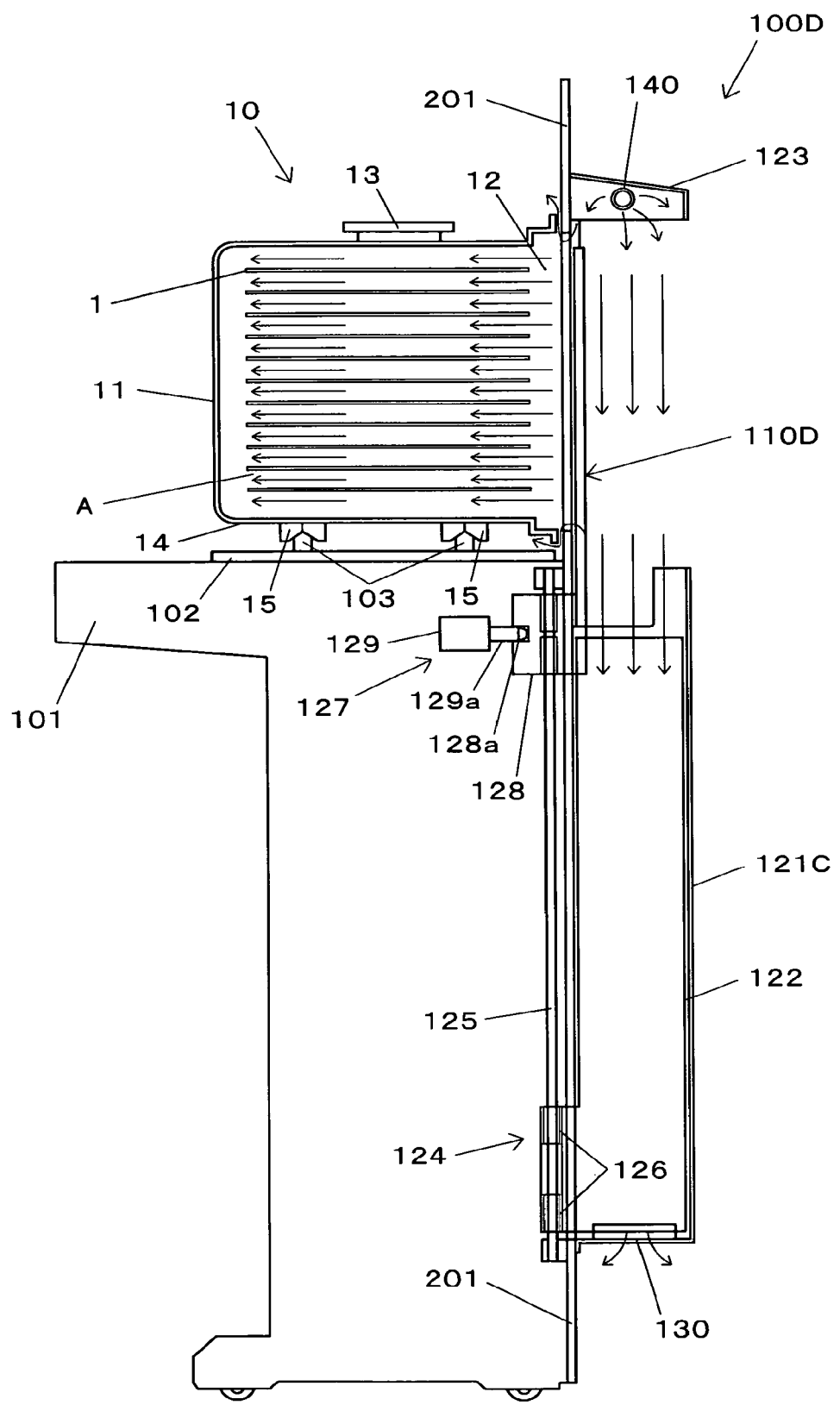
FIG. 13 is a side view which shows a nozzle unit of the load port, which has been held at its extended position, according to the fifth embodiment of the present invention.

As shown in FIGS. 12 and 13, the difference between the load port 100D and the load port 100 is that the load port 100D includes a nozzle unit 110D instead of the nozzle unit 110.

The nozzle unit 110D comprises thin plate-shaped components which can be stored within the storage portion 121C. The nozzle unit 110D is arranged outside of the course H (see FIG. 4) of the outer edge of the wafer 1 which is transferred from the wafer carrier 10 to the wafer processing apparatus. The nozzle unit 110D has nozzle outlets formed at positions corresponding to the spaces A between the wafers 1. The nozzle outlets are formed in the nozzle unit 110D at predetermined intervals along the longitudinal direction. Each nozzle outlet is formed with a diameter equal to or smaller than ½ of the thickness of the nozzle unit 110D (e.g., with a diameter of ⅓ of the thickness of the nozzle unit 110D) (see FIG. 6).

The load port 100D includes a nozzle unit elevating/holding mechanism 127 that provides a function of extending the nozzle unit 110D toward the door opening portion 202 from the storage portion 121C, and an function of holding the nozzle unit 110D at the extended position. The nozzle unit elevating/holding mechanism 127 includes: a slide member 128 formed at the lower portion of the nozzle unit 110D; a holding member 129 that allows the nozzle unit 110D to be held at the extended position; etc. The slide member 128 is mounted on a protrusion formed at the lower portion of the side-face cover member 122, and includes ball slides or the like therewithin. Furthermore, the holding member 128 has a recess 128a formed in the side face that faces the holding member 129. On the other hand, the holding member 129 includes a holding pin 129a that allows it to be engaged with the recess 128a. Furthermore, the holding pin 129a is provided in a manner that allows it to be extended and retracted toward/from the recess 128a.

With such an arrangement, as shown in FIG. 12, the nozzle unit 110D is extended to the door opening portion 202 from the storage portion 121C by the slide member 128 according to the operation of the elevator mechanism 124. Subsequently, as shown in FIG. 13, the holding pin 129a of the holding member 129 is extended to the recess 128a of the slide unit 128 such that the holding pin 129a is engaged with the recess 128a, whereby the nozzle unit 110D is held at the extended position. On the other hand, upon retracting the holding pin 129a from the recess 128a, the nozzle unit 110D is retracted from the door opening portion 202 by the elevating operation of the aforementioned elevator mechanism 124, whereby the nozzle unit 110D is stored within the storage portion 121C.

With such an arrangement, the nozzle unit 110D is extended to the door opening portion 202 after the side-face cover member 122 has been stored within the storage portion 121 by the elevator mechanism 124. Furthermore, in this case, the nozzle unit 110D is arranged outside of the course H of the outer edge of the wafer 1. Thus, such an arrangement allows the atmosphere of the wafer carrier 10 to be purged while transferring the wafer 1 to the processing space for predetermined processing by the wafer transfer robot of the wafer processing apparatus. This improves the operation efficiency.

Furthermore, the load port 100D includes the nozzle unit elevating/holding mechanism 127 using the operation of the elevator mechanism 124, instead of a particular turning mechanism provided for the storage portion 121 for turning the nozzle unit 110, unlike the load port 100. This provides a simpler mechanism of the storage portion 121.

Sixth Embodiment

Figure 14A:
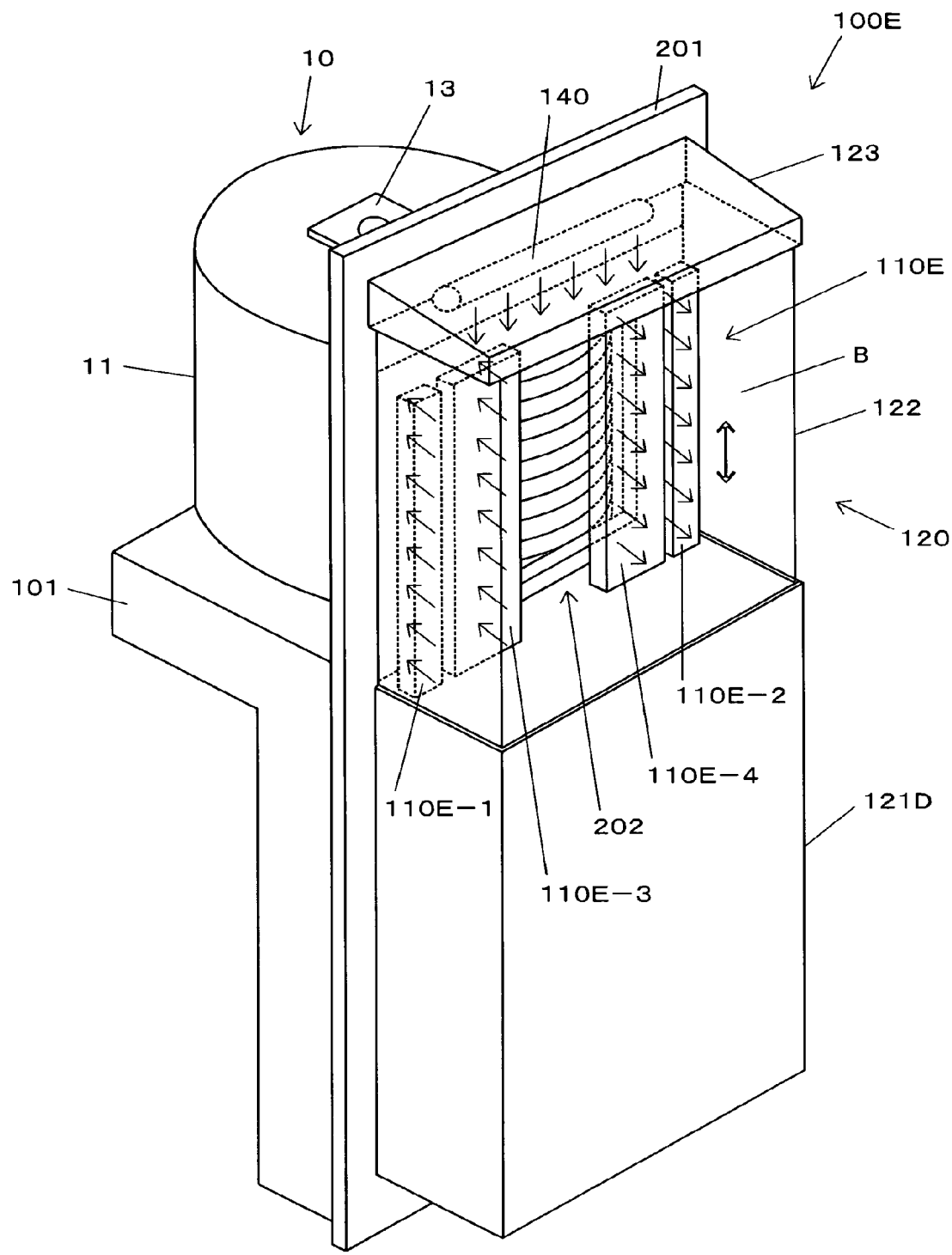
FIG. 14A is a side view which shows a load port with the wafer carrier mounted in a purge step, according to the sixth embodiment of the present invention.
Figure 14B:
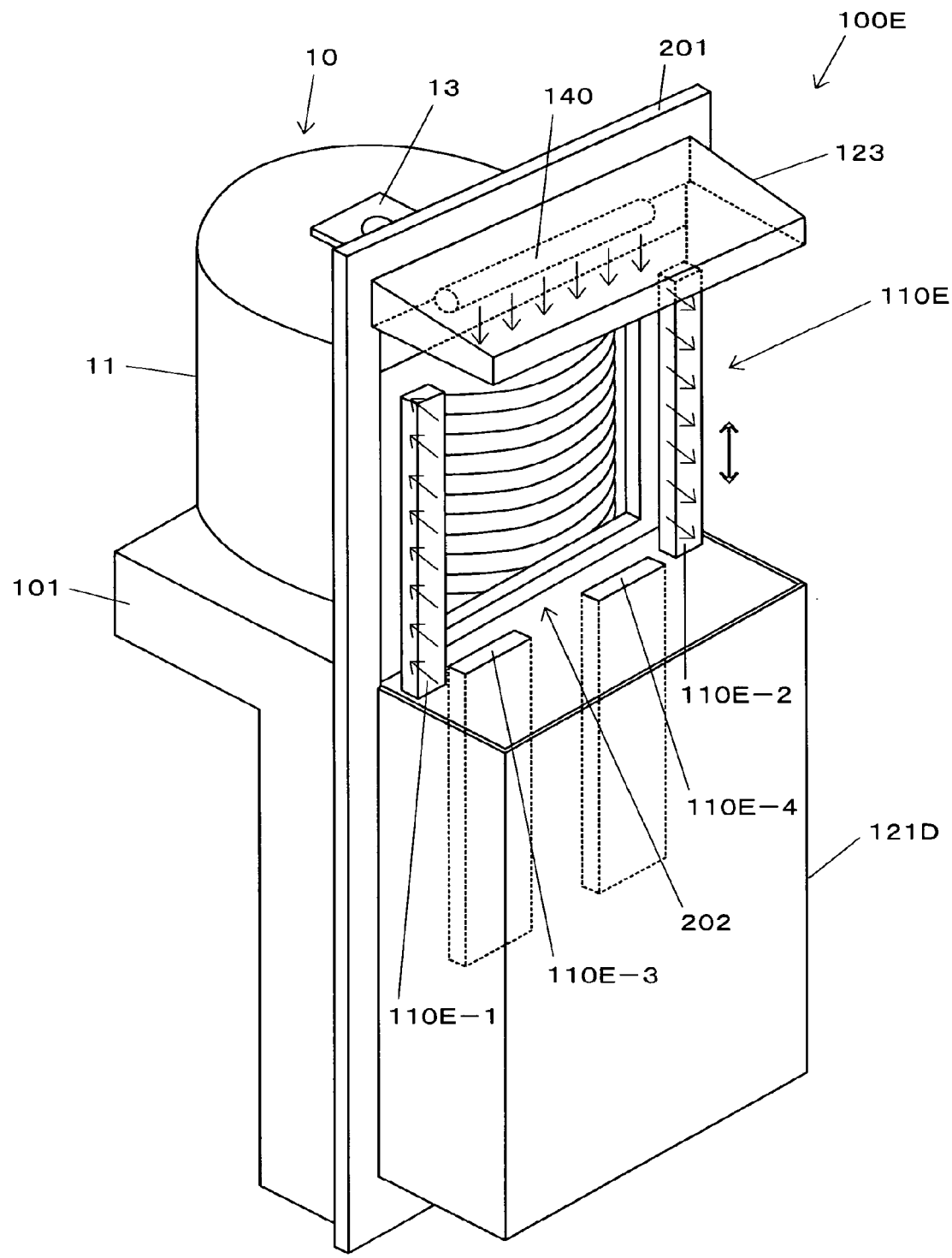
FIG. 14B is a side view which shows a state in which a first nozzle unit and a second nozzle unit of the load port according to the sixth embodiment of the present invention are held by their extended positions, and a third nozzle unit and a fourth nozzle unit thereof have been retracted from the door opening portion.

As shown in FIGS. 14A and 14B, the difference between the load port 100E and the load port 100 is that the load port 100E includes a nozzle unit 110E instead of the nozzle unit 110.

The nozzle unit 110E comprises a first nozzle unit 110E-1, a second nozzle unit 110E-2, a third nozzle unit 110E-3, a fourth nozzle unit 110E-4, etc. Each of these nozzle components is formed in the shape of a thin plate, and can be stored within the storage portion 121D. The first nozzle unit 110E-1 and the second nozzle unit 110E-2 are disposed near both side ends of the door opening portion 202, and have a smaller width than that of the third nozzle unit 110E-3 and the fourth nozzle unit 110E-4 (e.g., with a width ratio of around 3:7).

When the first nozzle unit 110E-1 and the second nozzle unit 110E-2 are extended to the door opening portion 202, the first nozzle unit 110E-1 and the second nozzle unit 110E-2 are positioned outside of the course H (see FIG. 4) of the outer edge of the wafer 1 which is transferred from the wafer carrier 10 to the wafer processing apparatus. On the other hand, the third nozzle unit 110E-3 and the fourth nozzle unit 110E-4 are disposed around the center of the door opening portion 202.

The load port 100E includes an unshown nozzle unit elevator mechanism (described later) for raising the first nozzle unit 110E-1, the second nozzle unit 110E-2, the third nozzle unit 110E-3, and the fourth nozzle unit 110E-4. With such an arrangement, each nozzle component of the nozzle unit 110E is formed in the shape of a thin plate. Such an arrangement enables the nozzle unit elevator mechanism to raise the nozzle components of the nozzle unit 110E independently of one another without interference with the load port door opening/closing mechanism 170, thereby extending the nozzle components of the nozzle unit 110E to the door opening portion 202 independently of one another.

The nozzle unit 110E includes nozzle outlets formed approximately over the entire area thereof such that they correspond to the spaces between the adjacent wafers 1. The nozzle outlets are formed in the nozzle unit 110E in the shape of a matrix at predetermined intervals. Each nozzle outlet is formed with a diameter equal to or smaller than ½ of the thickness of the nozzle unit 110E (e.g., with a diameter of ⅓ of the thickness of the nozzle unit 110E).

With such an arrangement, the nozzle outlets are formed approximately over the entire area of the nozzle unit 110E in the shape of a matrix such that they correspond to the spaces A between the adjacent wafers 1. Such an arrangement generates an outflow of the purge gas from approximately the entire area of the first nozzle unit 110E-1 and the third nozzle unit 110E-3, and an inflow thereof into approximately the entire area of the second nozzle unit 110E-2 and the fourth nozzle unit 110E-4. Thus, the load port 100E provides high-efficiency, thereby reducing the period of time necessary for the purge.

Next, a description will be given regarding the nozzle unit elevator mechanism of the load port 100E.

The nozzle unit elevator mechanism includes: a motor for directly driving the third nozzle unit 110E-3 and the fourth nozzle unit 110E-4; an unshown nozzle unit engaging pin for engaging the third nozzle unit 110E-3 and the fourth nozzle unit 110E-4 with the first nozzle unit 110E-1 and the second nozzle unit 110E-2; an unshown side-cover member engaging pin for engaging the third nozzle unit 110E-3 and the fourth nozzle unit 110E-4 with the side-face cover member 122; etc.

In an early stage of the purge step, the nozzle unit elevator mechanism extends the nozzle unit engaging pin, thereby engaging the third nozzle unit 110E-3 and the fourth nozzle unit 110E-4 with the first nozzle unit 110E-1 and the second nozzle unit 110E-2. At the same time, the nozzle unit elevator mechanism extends the side-face cover member engaging pin, thereby engaging the third nozzle unit 110E-3 and the fourth nozzle unit 110E-4 with the side-face cover member 122.

Next, upon driving the motor, the nozzle unit elevator mechanism raises the first nozzle unit 110E-1 and the second nozzle unit 110E-2 to the door opening portion 202, as well as raising the third nozzle unit 110E-3 and the fourth nozzle unit 110E-4 to the door opening portion 202. Furthermore, the nozzle unit elevator mechanism raises the side-face cover member 122 from the storage portion 121D.

In this stage, the load port 100E enter a state in which the first nozzle unit 110E-1 through the fourth nozzle unit 110E-4 are raised to the door opening portion 202, and the side-face cover member 122 is also raised from the storage portion 121D so as to form the airtight space B as shown in FIG. 14A. In this state, the load port 100E purges the atmosphere of the wafer carrier 10.

Now, let us consider the case in which, after the purge step described above, the wafer 1 is transferred to the processing space provided within the wafer processing apparatus for predetermined processing. In this case, the load port 100E stores the third nozzle unit 110E-3, the fourth nozzle unit 110E-4, and the side-face cover member 122 within the storage portion 121D by the nozzle unit elevator mechanism, as shown in FIG. 14B. In order to perform such an operation, the load port 100E retracts the nozzle unit engaging pin of the nozzle unit elevator mechanism. At the same time, the load port 100E holds the first nozzle unit 110E-1 and the second nozzle unit 110E-2 at the extended positions using a mechanism similar to that including the holding pin 129a and the recess 128a of the nozzle unit elevating/holding mechanism 127 described above (see FIGS. 12 and 13). Such an arrangement enables the load port 100E to perform purging using the first nozzle unit 110E-1 and the second nozzle unit 110E-2 while transferring the wafer 1.

Furthermore, the load port 100E retracts the side-face cover engaging pin of the nozzle unit elevator mechanism, raises the third nozzle unit 110E-3 and the fourth nozzle unit 110E-4 to the door opening portion 202, and a purge is performed using the first nozzle unit 1 through the fourth nozzle unit 4 again while predetermined processing is performed for the wafer 1, as shown in FIG. 14A.

Before the wafer 1 subjected to the predetermined processing is stored within the wafer carrier 10 again, the load port 100E stores the third nozzle unit 110E-3 and the fourth nozzle unit 110E-4 within the storage portion 121D by the nozzle unit elevator mechanism. Such an arrangement allows the load port 100E to perform the purge using the first nozzle unit 110E-1 and the second nozzle unit 110E-2 while transferring the wafer 1. This improves the operation efficiency as compared with the above-described load port 100A.

Furthermore, the load port 100E can raise/lower the third nozzle unit 110E-3 and the fourth nozzle unit 110E-4 for each step for transferring the wafer 1. Such an arrangement prevents deterioration in the purge state during the processing, as compared with the load ports 100, 100B, 100C, and 100D described above.

After completion of the predetermined processing for all the wafers 1 stored within the wafer carrier 10, the load port 100E extends the nozzle unit engaging pin of the nozzle unit elevator mechanism, thereby engaging the third nozzle unit 110E-3 and the fourth nozzle unit 110E-4 with the first nozzle unit 110E-1 and the second nozzle unit 110E-2. Furthermore, the load port 100E retracts the first nozzle unit 110E-1 and the second nozzle unit 110E-2 from their extended positions using the same mechanism as the nozzle unit elevating/holding mechanism 127, thereby storing the first nozzle unit 110E-1 and the second nozzle unit 110E-2 within the storage portion 121D, as well as storing the third nozzle unit 110E-3 and the fourth nozzle unit 110E-4 within the storage portion 121D. Subsequently, the wafer carrier 10 is closed with the carrier door 16 by the load port door opening/closing mechanism 170.

Seventh Embodiment

A load port 700 according to a seventh embodiment is similar to the second embodiment, except for the modification made to the second nozzle unit 110A-2 of the second embodiment.

Figure 16:
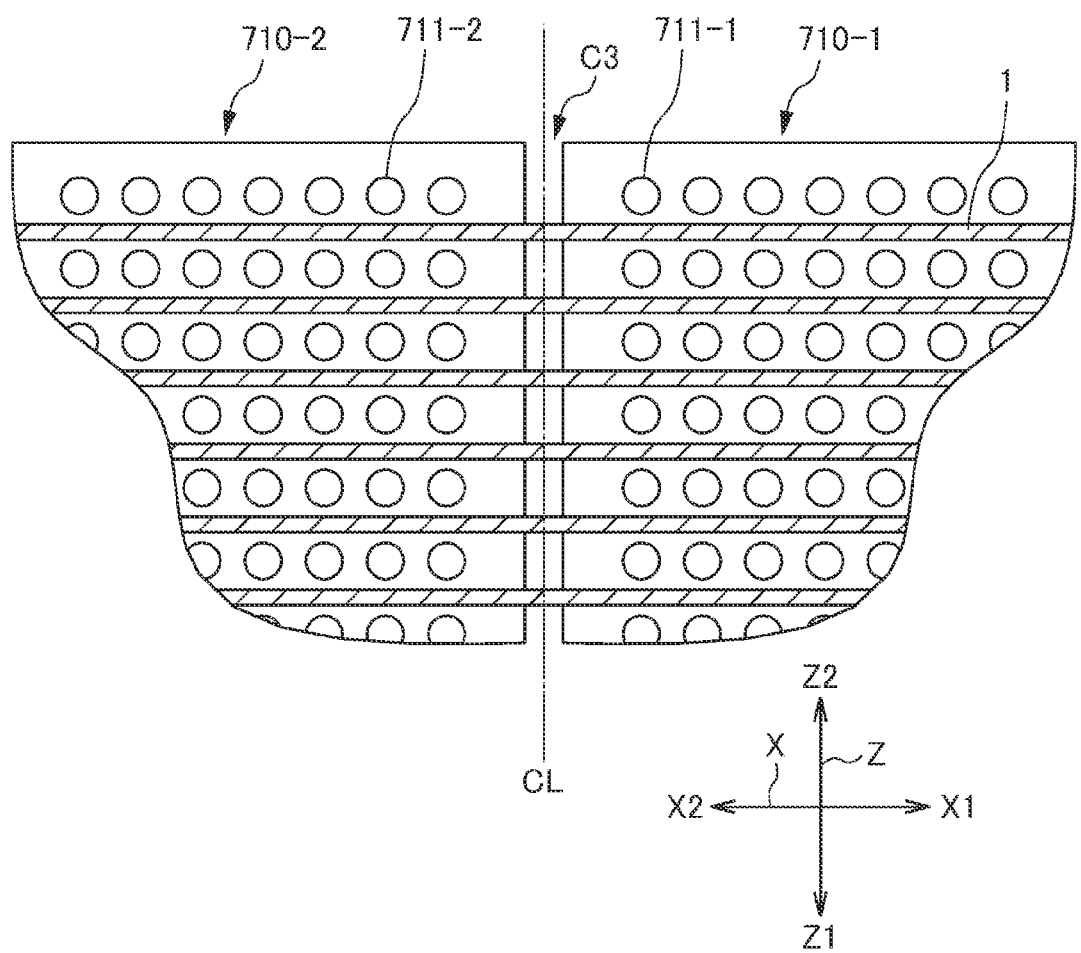
FIG. 16 is an enlarged view (sectional view along line 16-16 of FIG. 15) showing a gas supply plate and a partition according to the seventh embodiment when viewed from nozzles.
Figure 17:
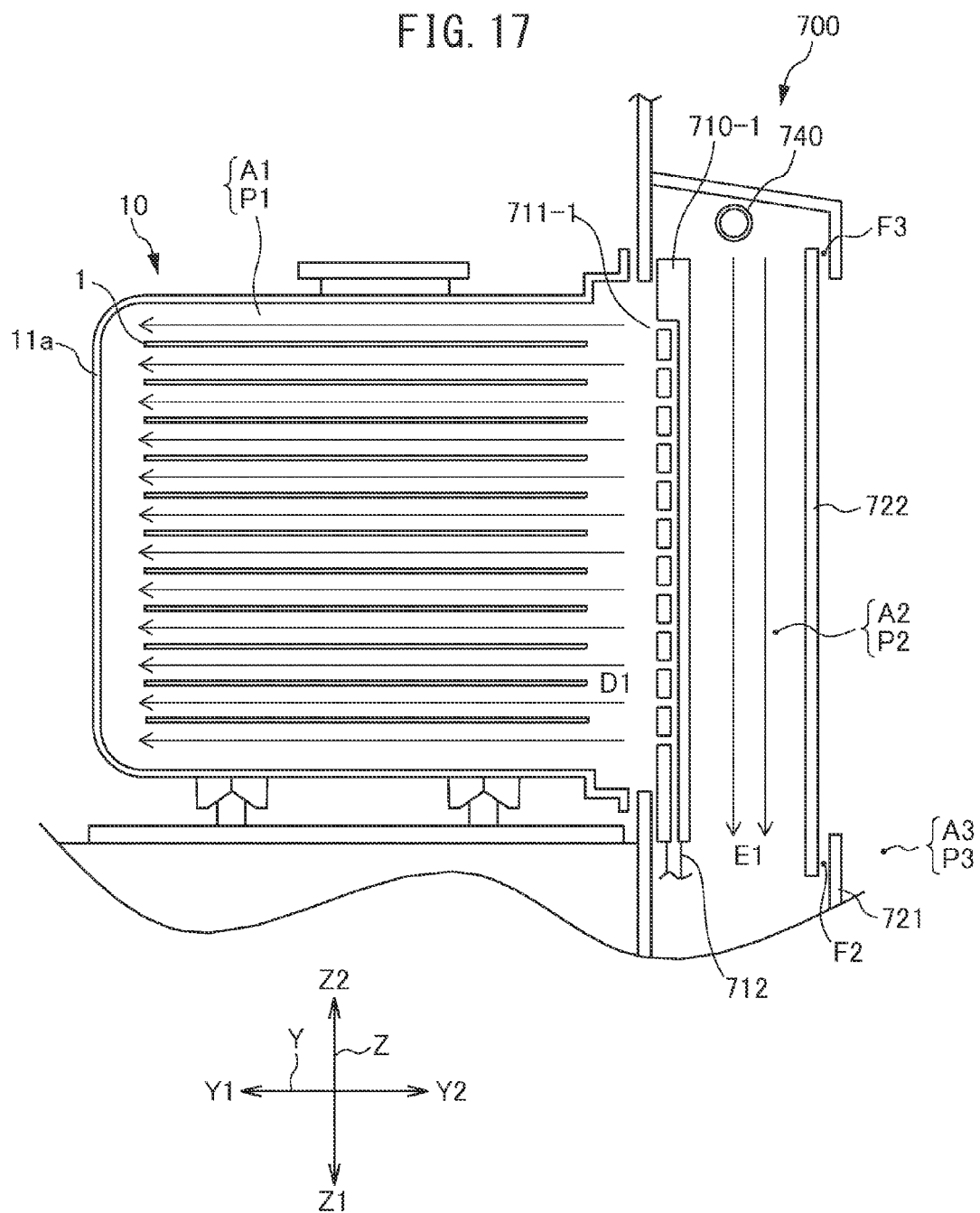
FIG. 17 is a side sectional view showing the load port and the wafer carrier according to the seventh embodiment.

FIG. 15 is a plan sectional view showing the load port 700 and a wafer carrier according to the seventh embodiment. FIG. 16 is an enlarged view (sectional view along line 16-16 of FIG. 15) showing a gas supply plate 710-1 and a partition 710-2 according to the seventh embodiment when viewed from nozzles. FIG. 17 is a side sectional view showing the load port 700 and the wafer carrier 10 according to the seventh embodiment.

Although, FIG. 15 typically shows three pieces of outlet nozzles and inlet nozzles respectively, a large number of outlet nozzles 711-1 are provided at the gas supply plate 710-1 and a large number of inlet nozzles 711-2 are provided at the partition 710-2, as shown in FIG. 16.

In addition, descriptions will be provided for embodiments and figures below according to the coordinates as shown in the plan sectional view of FIG. 15: a left-right direction X, depth direction Y and vertical direction Z perpendicular to a surface of a wafer 1.

Setup of Load Port 700

As shown in FIGS. 15-17, the load port 700 includes the gas supply plate 710-1, the partition 710-2, an auxiliary nozzle unit 740 (gas outlet), and an intermediate room A2.

The gas supply plate 710-1 corresponds to the first nozzle unit 110A-1 (see FIG. 9) of the second embodiment. As shown in FIG. 15, the gas supply plate 710-1 is shaped like a plate.

The gas supply plate 710-1 is disposed in a region C1 of a region C facing an aperture of the wafer carrier 10 on a left side X1 (one side) with respect a center line CL along the depth direction Y in which the wafer 1 is conveyed. In this manner, the gas supply plate 710-1 is disposed as separating the region C1, which constitutes a part of a region between the intermediate room A2 and the wafer carrier 10.

The gas supply plate 710-1 is disposed such that there is a gap G1 that allows a carrier space A1 inside the wafer carrier 10 to fluidly communicate with the intermediate room A2. The gap G1 is configured to prevent the gas supply plate 710-1 from coming into contact not only with a cover 721 of an accommodating portion but also with a fixed wall 730 so as to restrict the generation of dust, when the gas supply plate 710-1 is driven by a drive unit.

The gas supply plate 710-1 includes a plurality of outlet nozzles 711-1. As show in FIG. 16, the outlet nozzles 711-1 are provided at a face of the gas supply plate 710-1 that faces the wafer carrier 10.

The outlet nozzles 711-1 are each formed in agreement with a gap between adjacent wafers. The outlet nozzles 711-1 are disposed at uniform intervals in the left-right direction X parallel to the surfaces of wafers 1. In addition, the outlet nozzles 711-1 are disposed at uniform intervals in the vertical direction Z in which the wafers 1 are layered. Accordingly, the outlet nozzles 711-1 are formed uniformly in an entirety of the gas supply plate 710-1.

As shown in FIG. 15, the outlet nozzles 711-1 is connected to a purge gas supply unit (not shown) through a pipe 712. The purge gas is supplied to the outlet nozzles 711-1 by a pump and the like.

As shown in FIG. 15, the partition 710-2 corresponds to the second nozzle unit 110A-2 of the second embodiment (see FIG. 9). The partition 710-2 is shaped like a plate.

The partition 710-2 is disposed in a region C2 of the region C facing the aperture of the wafer carrier 10 on a right side X2 (another side) opposite to the gas supply plate 710-1 with respect the center line CL. In this manner, the partition 710-2 is disposed as separating the region C2, which constitutes a part of a region between the intermediate room A2 and the carrier space A1. The partition 710-2 is disposed such that there are a gap C3 between the partition 710-2 and the gas supply plate 710-1. The gap C3 is formed along the center line CL.

In a similar manner to the gas supply plate 710-1, the partition 710-2 is disposed to have a gap G2 that causes the carrier space A1 to fluidly communicate with the intermediate room A2.

The partition 710-2 includes a plurality of inlet nozzles 711-2. As shown in FIG. 16, the inlet nozzles 711-2 are each disposed in agreement with a gap between adjacent wafers 1, and at uniform intervals in the left-right direction X and vertical direction Z respectively to be formed in an entirety of the partition 710-2, in a similar manner to the outlet nozzles 711-1.

As shown in FIG. 15, the inlet nozzles 711-2 are through apertures that penetrate the partition 710-2 from the carrier space A1 to the intermediate room A2 in the depth direction Y. A pump, pipe or the like to suck the purge gas is not connected to the inlet nozzles 711-2, differing from the outlet nozzles 711-1.

As shown in FIG. 17, the auxiliary nozzle unit 740 corresponds to the auxiliary nozzle unit 140 (see FIG. 9) of the second embodiment.

It should be noted that the auxiliary nozzle unit 740 is configured like a plate instead of a cylinder. Since the plate configuration allows nozzles for discharging the purge gas to be formed at an entire lower surface (surface facing inside the intermediate room A2) of the auxiliary nozzle unit 740, it is possible to cause the purge gas to move downward efficiently.

The intermediate room A2 corresponds to the airtight space B of the second embodiment (see FIG. 9). When the gas replacement is performed, an elevator mechanism (see the elevator mechanism 124 in FIG. 13) drives the gas supply plate 710-1, the partition 710-2, and the side cover member 722 to be lifted, such that these components form the intermediate room A2.

Gas Replacement Operation Performed by Load Port 700

The gas replacement operation performed by the load port 700 will be described. Since controlling of the load port 700 during the gas replacement is similar to the embodiments 1 and 2, descriptions will be focused on the differences from the embodiments 1 and 2.

A control unit (see the control unit 160 of FIG. 7) performs the gas replacement operation according to the following steps.

Gas Movement from Carrier Space A1 to Intermediate Room A2

(1) As described above, the elevator mechanism drives the gas supply plate 710-1, the partition 710-2 and the side cover member 722 to be disposed as shown in FIGS. 15 and 17. More specifically, the gas supply plate 710-1 and the partition 710-2 are disposed in the respective regions C1 and C2 in the region facing the aperture of the wafer carrier 10, opposite to each other with respect to the center line CL. At the same time, the side cover member has already been driven upward. In this manner, the intermediate room A2 is formed.

(2) As shown in FIG. 17, the purge gas is supplied through the auxiliary nozzle unit 740 so as to create a flow of the purge gas descending in the intermediate room A2 (see an arrow E1).

(3) As shown in FIG. 17, the purge gas is supplied from the gas supply plate 710-1 towards gaps between adjacent wafers 1 in the carrier space A1. It should be noted that steps (3) and (4) may be performed simultaneously.

(4) The control unit controls an amount of the purge gas such that a pressure P2 of the intermediate room A2 is lower than a pressure P1 of the carrier space A1. Since the carrier space A1 is maintained airtight to some degree by the gas supply plate 710-1 and the partition 710-2, it is relatively easy to set the pressure P1 higher than the pressure P2.

Descriptions in detail will be provided for the gas flow in the carrier space A1 while step (4) is being performed.

(4-1) As shown in FIG. 15, the purge gas exiting from the outlet nozzles 711-1 moves substantially straight towards an inner wall 11*a* of the wafer carrier 10 in the depth direction Y in a left half region A1-1 of the carrier space A1 (see an arrow D1).

(4-2) A gas moving towards the inner wall 11*a* collides with a left curved surface 11*a*-1 to turn along the left curved surface 11*a*-1 (see an arrow D2). And the gas moves towards the partition 710-2 in a right half region A1-2 of the carrier space A1 (see an arrow D3). Since the gas collides with the curved surface 11*a*-1 not perpendicularly but having some angle, it may be similar that the gas collides with a slope. Accordingly, the curved surface 11*a*-1 does not apply a large amount of resistance to the gas, but helps the gas turn naturally.

(4-3) Since the gas having moved towards the partition 710-2 collides with the partition 710-2, the pressure of a region A1-3 (region closer to the wafer carrier 10 than the partition 710-2) adjacent to the partition 710-2 increases. Accordingly, the gas bypasses the region A1-3 to go back into the left region A1-1 (see an arrow D4).

(4-4) The gas having returned to the left region A1-1 moves again towards the inner wall 11*a* along with the purge gas supplied from the outlet nozzle 711-1 (see the arrow D1).

With the (4-1) to (4-4) the gas inside the carrier space A1 circulates between the wafers 1 over a substantially entire region of the carrier space A1 in one rotational direction (clockwise direction in FIG. 15).

(4-5) As described above, the pressure P2 of the intermediate room A2 is lower than the pressure P1 of the carrier space A1. Due to this pressure difference, a part of the gas in the region A1-3 adjacent to the partition 710-2 moves into the intermediate room A2 through the gap C3, the inlet nozzles 711-2 or the gap G2 (see arrows D5, D6 and D7).

As described above, the load port 700, which causes the gas inside the carrier space A1 to circulate and move into the intermediate room A2, provides the following advantages.

The outlet nozzles 711-1 are uniformly arranged over the entirety of the gas supply plate 710-1. This makes it possible to lower the velocity of the purge gas exiting from the outlet nozzles 711-1 and decrease accordingly an amount of the purge gas per outlet nozzle 711-1, even if the large amount of purge gas is supplied by the gas supply plate 710-1 at a time. In this manner, it is possible to lower the velocity of the gas inside the carrier space A1 and prevent an occurrence of a turbulent flow, creating a laminar flow on the surface of a wafer 1.

As described above, the gas forming a laminar flow on the surface of a wafer 1 circulates uniformly in the carrier space A1 and removes foreign materials (particles and moisture) adhered on the surface of the wafer 1.

In addition, the gas inside the carrier space A1 moves from an inner periphery to an outer periphery of the wafer 1. Accordingly, the foreign materials move from the inner periphery to the outer periphery. The foreign materials having moved to the outer periphery move from the wafer carrier 10 into the intermediate room A2 through the gap C3 or the inlet nozzles 711-2 along with the gas that moves along the partition 710-2 in the region A1-3 (see the arrows D5, D6 and D7).

Since the load port 700 promptly supplies the purge gas between the wafers 1 and discharges a gas originally existed in the carrier space A1, it is possible to perform the gas replacement operation within a short period of time. In addition, it is possible to discharge the foreign materials adhered to the wafers 1 from the carrier space A1 into the intermediate room 2. It should be noted that since the gas inside the intermediate room A2 descends as shown in FIG. 17, the gas coming from the carrier space A1 also descends to move into an accommodating portion so as to be collected (see an arrow E1).

Descriptions of a gas flow will now be provided for a case which differs from the seventh embodiment in that the gas supply plate 710-1 is disposed at a substantially central position of the region C facing the aperture of the wafer carrier 10 and the partition 710-2 is omitted.

When the gas supply plate 710-1 supplies the purge gas, the gas originally existed inside the carrier space A1 collides with the vicinities of a central portion of the inner wall 11a and branches off in the left-right direction X. Since this gas moves in a direction substantially perpendicular to the inner wall 11a, it collides with the vicinities of the central portion of the inner wall 11a in a front direction. Accordingly, this gas loses momentum to move in left and right directions. In addition, this gas in the vicinity of the central portion of the inner wall 11a tends to stagnate to decrease its flow velocity.

Furthermore, since the partition 710-2 is omitted, the gas branches off in the left and right directions. As a result, the most amount of the gas moves into the intermediate room A2 even if the gas comes back towards the aperture of the wafer carrier 10.

As described above, this case does not work well in circulating the gas originally existed inside the carrier space A1. Since the gas inside the carrier space A1 has a larger difference in the distribution of its velocities, it is difficult for the gas to move at a uniform velocity. Accordingly, it is necessary to increase the velocity of the purge gas exiting from the gas supply plate 710-1 in order to remedy a region where the velocity is relatively low, such that foreign materials adhered to a wafer 1 are removed. This requires increasing the velocities over an entirety of the gas inside the carrier space A1. However, it may be likely that a turbulent flow occurs on the surface of the wafer 1 and the removal of the foreign materials adhered to the wafer 1 is not effectively performed.

If the gas supply plate 710-1 is disposed at the substantially central position of the region C facing the aperture of the wafer carrier 10 and the partition 710-2 is omitted, it will decrease the momentum to circulate the gas inside the carrier space A1 and degrade the performance to remove the foreign materials adhered to the wafer 1.

With respect to the load port 700 according to the seventh embodiment, it is possible to increase the efficiency of gas replacement by replacing the gas inside the carrier space A1 while circulating the gas in one direction.

In addition, even if a part of the gas inside the intermediate room A2 moves into the carrier space A1, it is possible for the load port 700 to prevent a considerable decrease in the gas replacement efficiency.

Eighth Embodiment

A load port 800 differs from the seventh embodiment only in that modifications are made to the gas supply plate 710-1 and partition 710-2.

The same symbols or symbols having the same symbols at the last part (last two digits) are used for components having the same functions as the seventh embodiment in describing the eighth embodiment and drawings. And the descriptions will not be repeated for these similar components.

Figure 18:
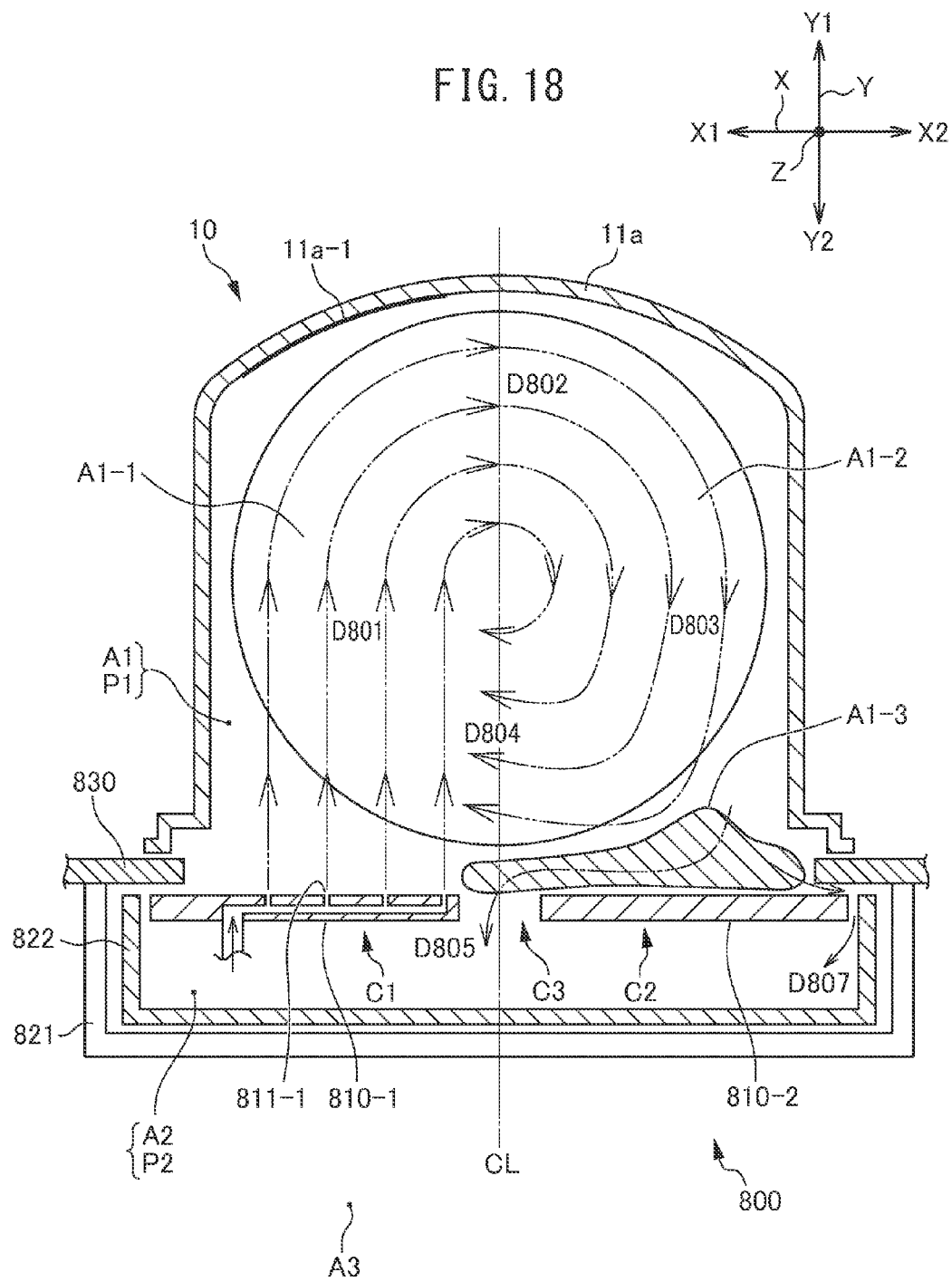
FIG. 18 is a plan sectional view showing a load port and a wafer carrier according to an eighth embodiment (corresponding to FIG. 15).

FIG. 18 is a plan sectional view showing the load port 800 and a wafer carrier 10 according to an eighth embodiment (corresponding to FIG. 15).

Setup of Load Port 800

The load port 800 includes a gas supply plate 810-1 and a partition 810-2. A gap C3 between the gas supply plate 810-1 and the partition 810-2 is greater than the seventh embodiment. In other words, the gas supply plate 810-1 and the partition 810-2 each have a dimension in a left-right direction X smaller than the seventh embodiment. The partition 810-2 is a flat plate without inlet nozzles.

Gas Replacement Operation Performed by Load Port 800

The gas replacement operation performed by the load port 800 will be described. As controlling of the load port 800 is similar to the seventh embodiment, descriptions will be focused on differences from the seventh embodiment.

A gas circulates in a carrier space A1 in a similar manner to the seventh embodiment. As described above, the inlet nozzles are not provided for the partition 810-2. Accordingly, a pressure of a region A1-3 adjacent to the partition 810-2 is greater than the seventh embodiment. This causes the gas to increase momentum to bypass the region A1-3 greater than the seventh embodiment (see an arrow D804). In this manner, this gas inside the carrier space A1 tends to circulate more easily than the seventh embodiment.

With respect to pressures, a pressure P2 of an intermediate room A2 is lower than a pressure P1 of the carrier space A1 in a similar manner to the seventh embodiment. The resulting pressure difference causes a part of the gas of the region A1-3 adjacent to the partition 810-2 to move into the intermediate room A2 through the gap C3 or gap G2 (see arrows D805 and 807). As described above, the gap C3 between the gas supply plate 810-1 and the partition 810-2 is greater than that of the seventh embodiment. Accordingly, a sufficient amount of gas of the region A1-3 moves into the intermediate room A2 through the gap C3, even if the partition 810-2 has no inlet nozzles.

The load port 800 of the eighth embodiment, which has the partition 810-2 of a flat plate, increases the efficiency of replacing the gas with a simple setup.

Ninth Embodiment

In a load port 900 of a ninth embodiment, the cover 721 of the seventh embodiment is modified to a cover 921.

Figure 19:
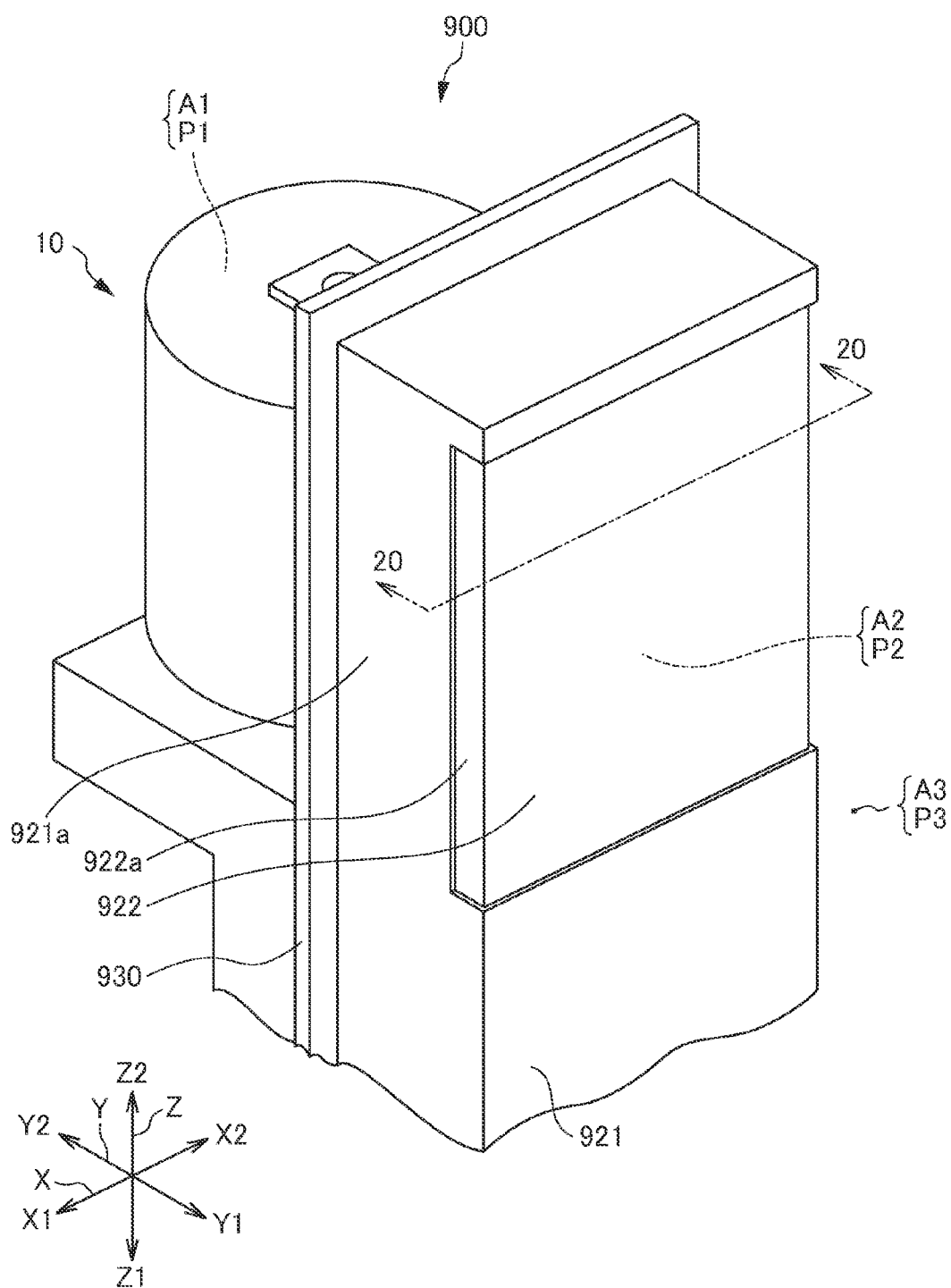
FIG. 19 is a perspective view showing a load port according to a ninth embodiment.
Figure 20:
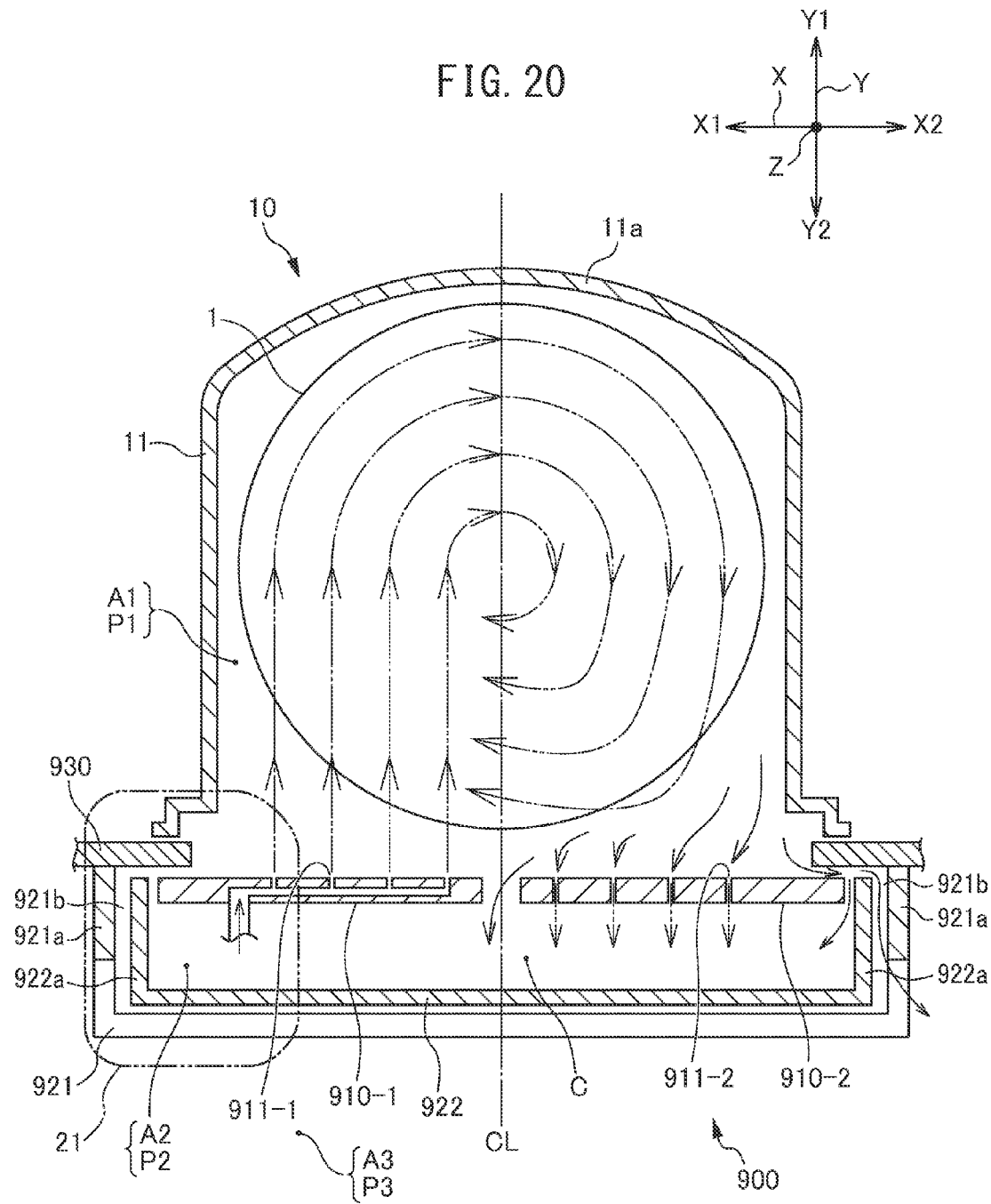
FIG. 20 is a plan sectional view (sectional view along line 20-20 of FIG. 19) showing the load port and a wafer carrier according to the ninth embodiment.

FIG. 19 is a perspective view showing the load port 900 according to the ninth embodiment. FIG. 20 is a plan sectional view (sectional view along line 20-20 of FIG. 19) showing the load port 900 and a wafer carrier 10 according to the ninth embodiment. The same symbols or symbols having the same symbols at the last part (last two digits) are used for components having the same functions as the seventh embodiment in describing the ninth embodiment and drawings. And the descriptions will not be repeated for these similar components.

Setup of Load Port 900

As shown in FIGS. 19 and 20, the cover 921 includes a side wall 921a. The side wall 921a projects from a fixed wall 930 towards a receiving room A3. An intermediate room A2 is formed while enclosed by the side wall 921a and a side cover member 922. A part of a side face of a side portion 922a of the side cover member 922 faces the side wall 921a. Accordingly, a narrow passage 921b that causes the intermediate room A2 to fluidly communicate with the receiving room A3 is formed between the side wall 921a and the side cover member 922.

Figure 21:
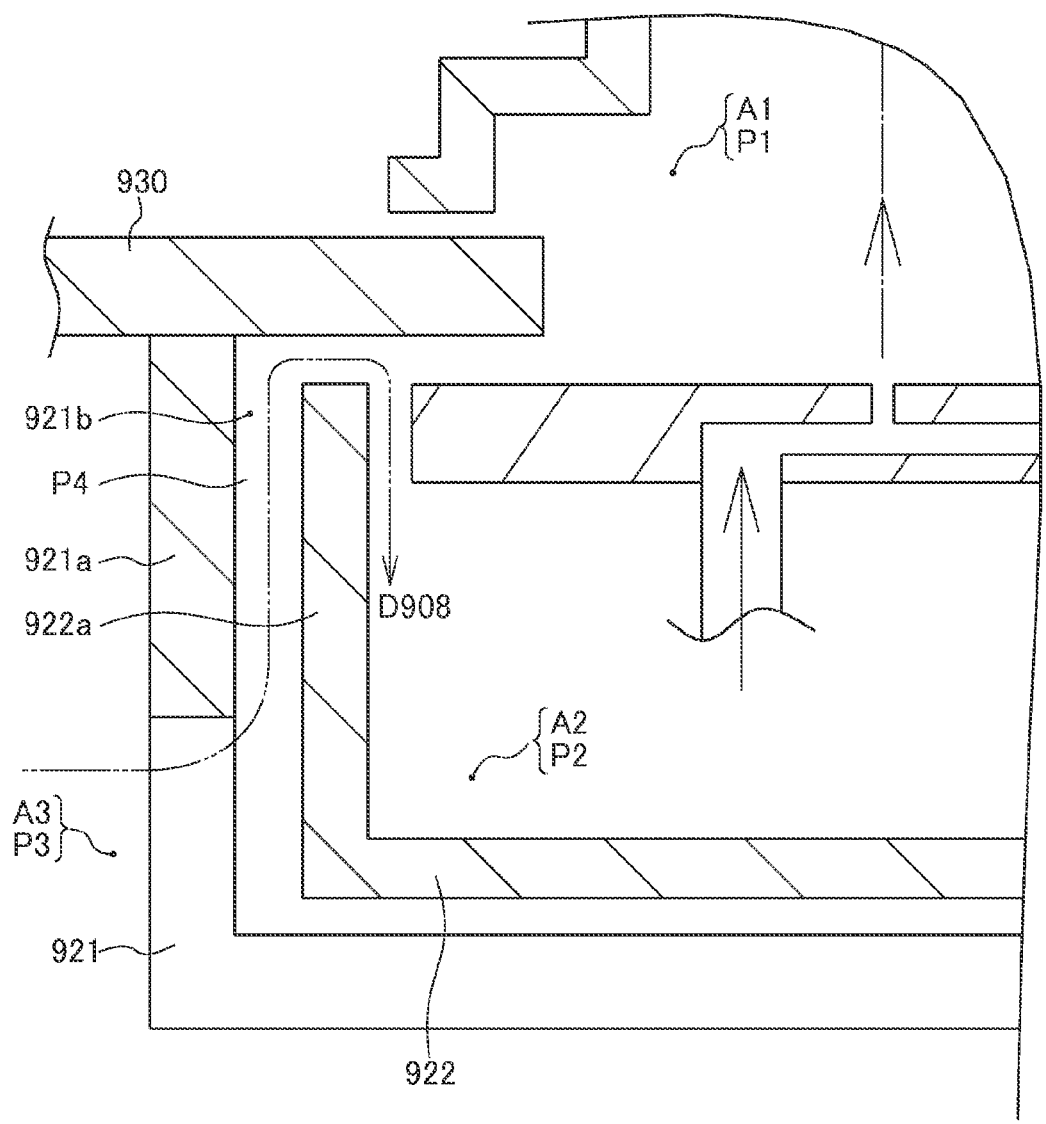
FIG. 21 is an enlarged view (inside a long dashed double-short dotted line of FIG. 20) showing the load port according to the ninth embodiment.

FIG. 21 is an enlarged view (inside a long dashed double-short dotted line of FIG. 20) showing the load port 900 according to the ninth embodiment.

Suppose a case in which a pressure P2 of the intermediate room A2 and a pressure P3 of the receiving room A3 satisfy: P2 is lower than P3. In this case, a gas inside the receiving room A3 tends to enter the intermediate room A2 through the passage 921b (see an arrow D908). However, the width of the passage 921b is so small that a pressure of a gas in the passage 921b is smaller than the pressure P3 due to the fluid resistance. It should be noted that passages F2 and F3 are formed on a lower side Z1 and an upper side Z2 respectively of the intermediate room A2, as shown in FIG. 17. Accordingly, the load port 900 prevents the gas in the receiving room A3 from entering the intermediate room A2. In this manner, the load port 900 increases the air tightness of the intermediate room A2 and facilitates controlling of the pressure P2 of the intermediate room A2.

As described above, the load port 900 according to the ninth embodiment facilitates controlling of the pressure 2 of the intermediate room A2 while the gas replacement operation is being performed.

It should be noted that the setup of the ninth embodiment is applicable to the load port 800 of the eighth embodiment and provides advantages similar to the ninth embodiment.

Tenth Embodiment

Figure 22:
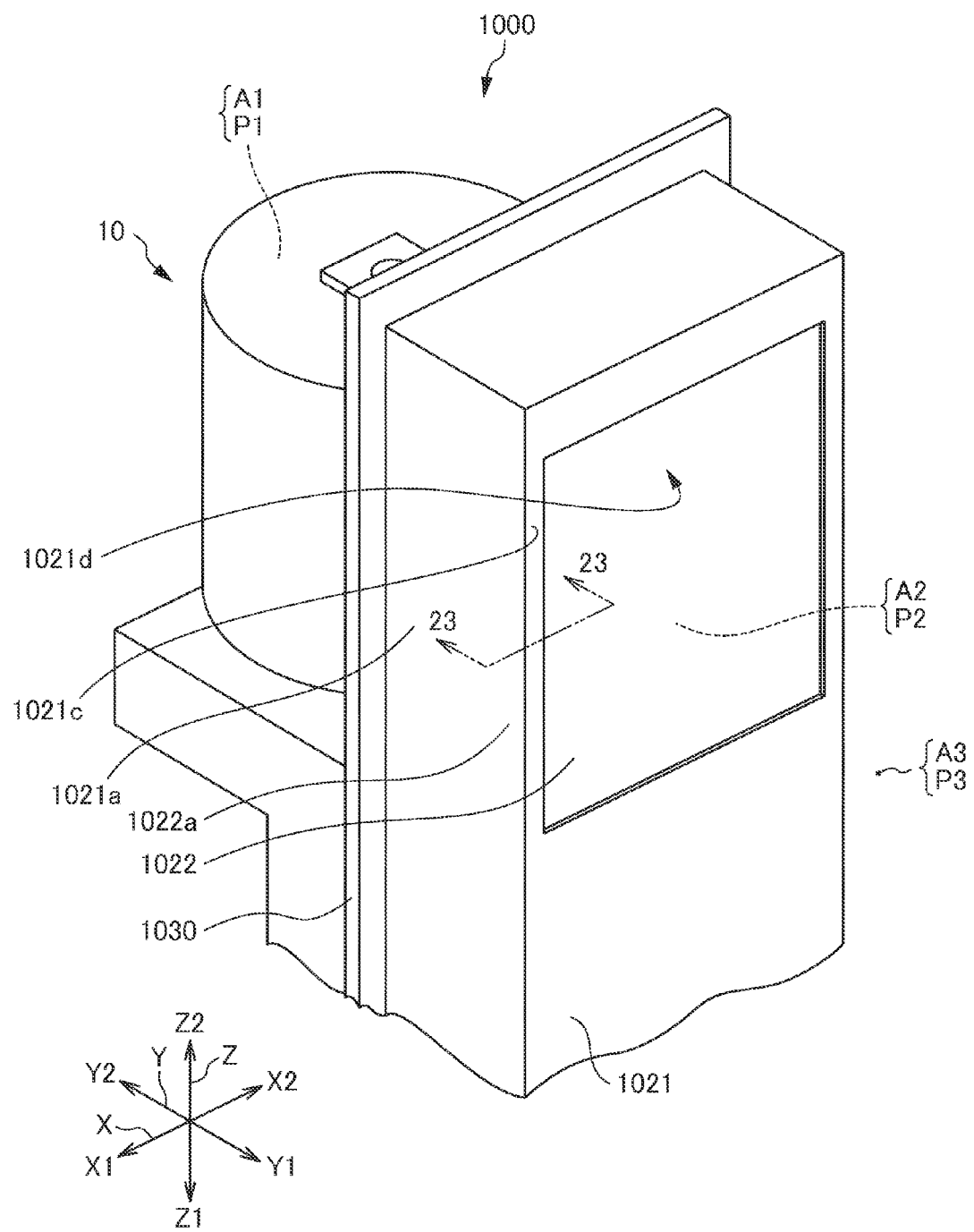
FIG. 22 is a perspective view showing a load port according to a tenth embodiment.
Figure 23:
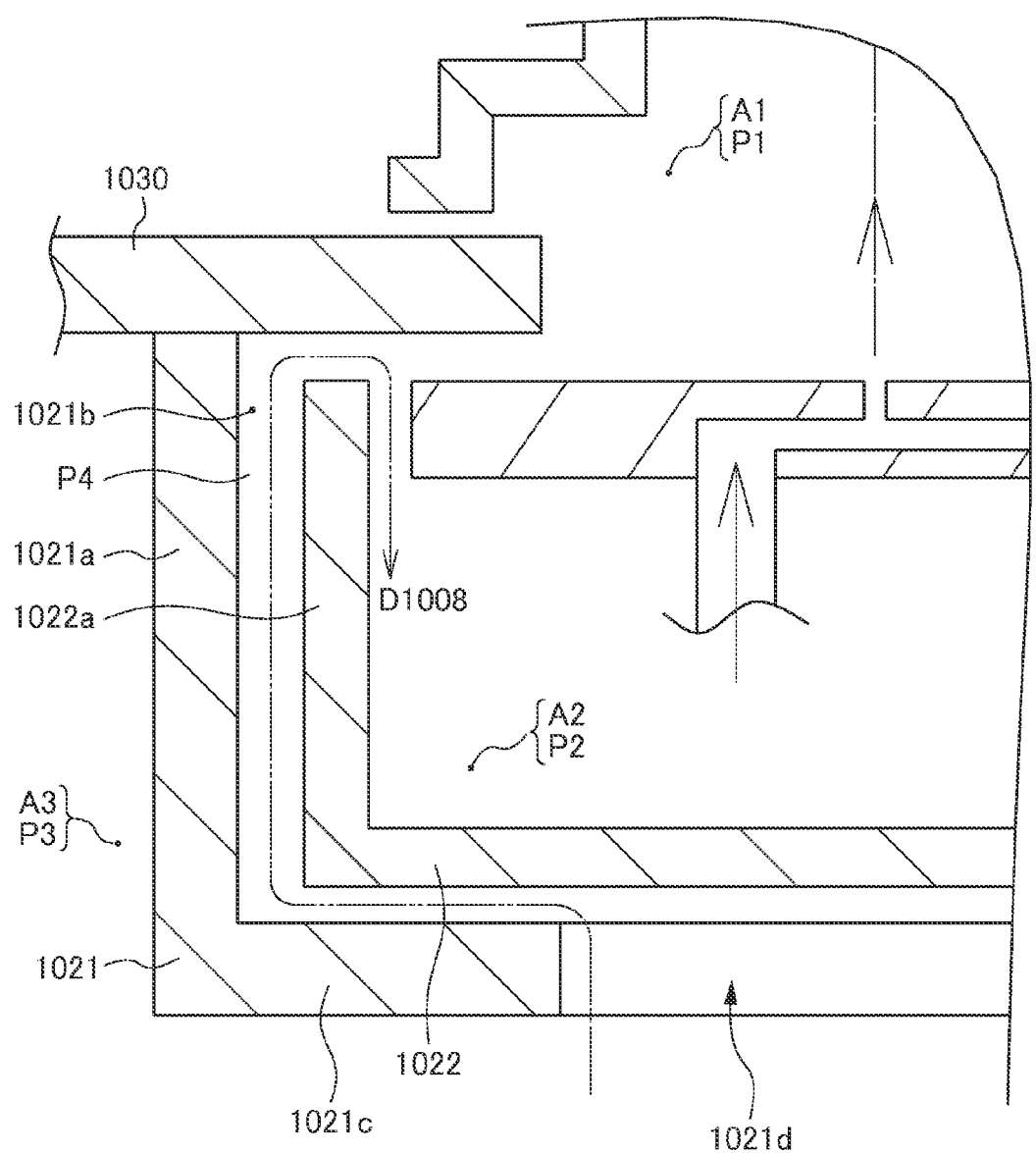
FIG. 23 is a plan sectional view (sectional view along line 23-23 of FIG. 22) showing a part of the load port according to the tenth embodiment.

In a load port 1000 of a tenth embodiment, the cover 921 of the ninth embodiment is modified to a cover 1021. FIG. 22 is a perspective view showing the load port 1000 according to the tenth embodiment. FIG. 23 is a plan sectional view (sectional view along line 23-23 of FIG. 22) showing the load port 1000 and a wafer carrier 10 according to the tenth embodiment. The same symbols or symbols having the same symbols at the last part (last two digits) are used for components having the same functions as the ninth embodiment in describing the tenth embodiment and drawings. And the descriptions will not be repeated for these similar components.

Setup of Load Port 1000

As shown in FIGS. 22 and 23, the cover 1021 has a side wall 1021a further extended compared with the ninth embodiment and an additional back wall 1021c.

The back wall 1021c is configured to enclose a side cover member 1022 on a side closer to a receiving room A3. The back wall 1021c has an aperture 1021d through which wafers are conveyed.

As shown in FIG. 23, the length of a narrow passage 1021b is greater than that of the ninth embodiment by the extended amount of the side wall 1021a and the additional back wall 1021c enclosing the side cover member 1022. When a gas moves inside the narrow passage 1021b (see an arrow D1008), a fluid resistance is greater than the ninth embodiment and consequently a pressure P4 is also greater than the ninth embodiment. Accordingly, the load port 1000 increases the air tightness of an intermediate room A2 and facilitates controlling of a pressure P2 of the intermediate room A2.

It should be noted that it may be possible to increase the fluid resistance applied to the entering gas if the width of the narrow passage is made further smaller.

Modifications

The present is not restricted to the above-described embodiments; rather, various modifications or changes may be made, which are also equivalently encompassed within the scope of the present invention.

(1) A description has been given as shown in FIG. 9 regarding an arrangement in which the nozzle unit 110A can be stored within the storage portion 121A. The present invention is not restricted to such an arrangement. Also, an arrangement may be made in which the nozzle unit 110A is provided in a manner that allows the nozzle components thereof to be turned with the side ends of the upper portion of the door opening portion 202 serving as their turning axes. With such an arrangement, the nozzle components of the nozzle unit 110A can be stored along the upper-portion cover member 123 such that they are stacked on one another.

Such an arrangement does not require any particular nozzle unit elevator mechanism in the storage portion 121A, thereby providing a simpler mechanism of the storage portion 121A.

(2) A description has been given regarding the load port 100 including the side-face cover elevator motor 168 for raising the side-face cover member 122, and a nozzle driving motor 166 for extending the first nozzle unit 110-1 toward the door opening portion 202. The present invention is not restricted to such an arrangement. An arrangement may be made which includes a cam that changes its position according to the action of raising the side-face cover member 122 from the storage portion 121. With such an arrangement, the first nozzle unit 110-1 may be extended to the door opening portion 202 according to the action of the cam.

Such an arrangement enables both the side-face cover member 122 and the first nozzle unit 110-1 to be extended to the door opening portion 202 using a single motor (e.g., the side-face cover elevator motor 168).

(3) A description has been given regarding an arrangement in which the control unit 160 retracts the nozzle unit 110 from the door opening portion 202 after the atmosphere of the wafer carrier 10 has been purged while maintaining the air-tight space B thus formed (S110). The nozzle unit, e.g., the nozzle unit 110, 110B, 110C, or 110D, which has been extended to the door opening portion 202, is located at a position outside of the course H of the outer edge of the wafer 1 which is transferred to the processing space provided within the wafer processing apparatus. Accordingly, with such an arrangement, the operation in Step S110 may be eliminated.

In this case, with the load port 100, 100B, 100C, or 100D having such a configuration, the side-face cover member 122 is stored within the storage portion 121 while maintaining the state in which the nozzle unit 110, 110B, 110C, or 110D is extended to the door opening portion 202. Such an arrangement enables the atmosphere of the wafer carrier 10 to be purged while transferring the wafer 1 toward the processing space by the wafer transfer robot of the wafer processing apparatus for performing predetermined processing. This improves the operation efficiency.

(4) A description has been given regarding the load port 100 employing the oxygen concentration sensor 164. Also, other appropriate sensors such as a nitrogen sensor or the like for detecting the ratio of the purge gas, the concentration of the purge gas, etc., may be employed as long as the sensor provides an indicator that indicating the purge degree of the atmosphere of the wafer carrier 10.

(5) A description has been given regarding an arrangement in which the control unit 160 switches the channel switching unit 163 according to the detection signal C detected by the oxygen concentration sensor 164. The present invention is not restricted to such an arrangement. Also, the control unit 160 may switch the channel switching unit 163 at a predetermined timing using a timer or the like.

What is claimed is:

1. A load port that is disposed between a wafer storage container having a lid member closing an aperture thereof and an inner wall of a curved surface so as to store wafers and a receiving room into which the wafers inside the wafer storage container are conveyed, the load port comprising:
    an intermediate room disposed between the wafer storage container and the receiving room;
    a gas supply plate configured like a plate;
    a partition configured like a plate to separate a partial region between the intermediate room and the wafer storage container;
    a gas outlet configured to supply a replacement gas into the intermediate room; and
    a driving unit configured to: evacuate the lid member from the aperture of the wafer storage container into the intermediate room; position the gas supply plate in a region facing the aperture of the wafer storage container on one side with respect to a center line along a direction in which the wafers are conveyed; and position the partition in a region facing the aperture of the wafer storage container on another side opposite to the one side with respect to the center line, when the load port performs gas replacement, wherein
    the gas supply plate includes a plurality of outlet nozzles configured to eject the replacement gas, each being arranged in agreement with a gap between adjacent wafers in a direction in which the wafers are layered, and the plurality of outlet nozzles is formed in an entirety of the gas supply plate;
    the gas supply plate and the gas outlet are configured to supply the replacement gas such that a pressure of the receiving room is regulated to be lower than a pressure of the intermediate room;
    a gas inside the wafer storage container moves in a direction along the inside wall of the curved surface due to the replacement gas ejected through the plurality of outlet nozzles, subsequently circulating in a substantially entire region inside the wafer storage container since a pressure of the wafer storage container becomes higher than a pressure of a region adjacent to the partition; and
    a part of the gas circulating inside the wafer storage container moves from inside the wafer storage container into the intermediate room through a gap between the gas supply plate and the partition due to a pressure difference between the wafer storage container and the intermediate room.

2. The load port according to claim 1, wherein
    the partition includes a plurality of inlet nozzles, each being arranged in agreement with the gap between the adjacent wafers in the direction in which the wafers are layered;
    the plurality of inlet nozzles is formed in an entirety of the partition; and
    a part of the gas circulating inside the wafer storage container moves from inside the wafer storage container into the intermediate room through the plurality of inlet nozzles in addition to the gap between the gas supply plate and the partition due to the pressure difference between the wafer storage container and the intermediate room.

3. The load port according to claim 2, further comprising:
    a side wall;
    a side cover member having a side face arranged opposite to the side wall when the load port performs the gas replacement, wherein
    the side wall and the side cover member form the intermediate room;
    the intermediate room includes a flow passage formed between the side wall and the side face of the side cover member; and
    the flow passage causes the receiving room to fluidly communicate with the intermediate room and applies fluid resistance to a gas moving from the receiving room into the intermediate room.

4. The load port according to claim 1, further comprising:
    a side wall;
    a side cover member having a side face arranged opposite to the side wall when the load port replaces the remaining gas inside the wafer storage container with the replacement gas, wherein
    the side wall and the side cover member form the intermediate room;
    the intermediate room includes a flow passage formed between the side wall and the side face of the side cover member; and
    the flow passage causes the receiving room to fluidly communicate with the intermediate room and applies fluid resistance to a gas moving from the receiving room into the intermediate room.

* * * * *